US010504792B2

United States Patent
Fu et al.

(10) Patent No.: US 10,504,792 B2
(45) Date of Patent: Dec. 10, 2019

(54) SELF-ALIGNED NANOWIRE FORMATION USING DOUBLE PATTERNING

(71) Applicant: Taiwan Semiconductor Manufacturing Company, Ltd., Hsinchu (TW)

(72) Inventors: Ching-Feng Fu, Taichung (TW); De-Fang Chen, Hsinchu (TW); Yu-Chan Yen, Taipei (TW); Chia-Ying Lee, New Taipei (TW); Chun-Hung Lee, Hsinchu (TW); Huan-Just Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/223,390

(22) Filed: Dec. 18, 2018

(65) Prior Publication Data

US 2019/0122936 A1 Apr. 25, 2019

Related U.S. Application Data

(60) Continuation of application No. 15/495,150, filed on Apr. 24, 2017, now Pat. No. 10,163,723, which is a
(Continued)

(51) Int. Cl.
*H01L 21/8234* (2006.01)
*H01L 21/308* (2006.01)
(Continued)

(52) U.S. Cl.
CPC .. *H01L 21/823487* (2013.01); *H01L 21/3086* (2013.01); *H01L 21/3088* (2013.01);
(Continued)

(58) Field of Classification Search
CPC ......... H01L 21/823487; H01L 23/5226; H01L 29/78696; H01L 29/78642;
(Continued)

(56) References Cited

U.S. PATENT DOCUMENTS 7,517,806 B2 * 4/2009 Bryant ................ H01L 21/3086
438/734
2007/0077349 A1 * 4/2007 Newman ................ B82Y 20/00
427/66
(Continued)

FOREIGN PATENT DOCUMENTS

CN 1846309 A 10/2006
CN 101595565 A 12/2009
(Continued)

*Primary Examiner* — Edward Chin
(74) *Attorney, Agent, or Firm* — Slater Matsil, LLP

(57) ABSTRACT

A method includes forming a pattern-reservation layer over a semiconductor substrate. The semiconductor substrate has a major surface. A first self-aligned multi-patterning process is performed to pattern a pattern-reservation layer. The remaining portions of the pattern-reservation layer include pattern-reservation strips extending in a first direction that is parallel to the major surface of the semiconductor substrate. A second self-aligned multi-patterning process is performed to pattern the pattern-reservation layer in a second direction parallel to the major surface of the semiconductor substrate. The remaining portions of the pattern-reservation layer include patterned features. The patterned features are used as an etching mask to form semiconductor nanowires by etching the semiconductor substrate.

20 Claims, 25 Drawing Sheets

Related U.S. Application Data division of application No. 14/289,167, filed on May 28, 2014, now Pat. No. 9,633,907.

(51) Int. Cl.

| | | |
|---|---|---|
| *H01L 29/423* | (2006.01) | |
| *H01L 29/66* | (2006.01) | |
| *H01L 29/786* | (2006.01) | |
| *H01L 21/306* | (2006.01) | |
| *H01L 21/311* | (2006.01) | |
| *H01L 23/528* | (2006.01) | |
| *H01L 27/088* | (2006.01) | |
| *H01L 29/06* | (2006.01) | |
| *H01L 29/78* | (2006.01) | |
| *H01L 23/522* | (2006.01) | |

(52) U.S. Cl.
 CPC .. *H01L 21/30604* (2013.01); *H01L 21/31111* (2013.01); *H01L 21/823412* (2013.01); *H01L 21/823418* (2013.01); *H01L 23/528* (2013.01); *H01L 23/5226* (2013.01); *H01L 27/088* (2013.01); *H01L 29/0676* (2013.01); *H01L 29/42392* (2013.01); *H01L 29/66742* (2013.01); *H01L 29/7827* (2013.01); *H01L 29/78642* (2013.01); *H01L 29/78696* (2013.01); *H01L 2924/0002* (2013.01)

(58) Field of Classification Search
 CPC ......... H01L 29/66742; H01L 29/42392; H01L 21/3088; H01L 29/7827; H01L 29/0676; H01L 27/088; H01L 23/528; H01L 21/823418; H01L 21/823412; H01L 21/31111; H01L 21/3086; H01L 21/30604; H01L 2924/0002
 See application file for complete search history.

(56) References Cited

U.S. PATENT DOCUMENTS

| | | | | |
|---|---|---|---|---|
| 2007/0077379 | A1* | 4/2007 | Passera | B29C 45/1706 428/35.7 |
| 2010/0102380 | A1* | 4/2010 | Ohlsson | B82Y 10/00 257/329 |
| 2010/0258710 | A1* | 10/2010 | Wiese | H01L 25/167 250/214.1 |
| 2010/0295023 | A1* | 11/2010 | Franklin | B82Y 10/00 257/24 |
| 2011/0211348 | A1* | 9/2011 | Kim | H01L 25/0753 362/235 |
| 2014/0024215 | A1* | 1/2014 | Cheng | H01L 21/0337 438/689 |
| 2015/0048441 | A1* | 2/2015 | Colinge | B82Y 10/00 257/329 |

FOREIGN PATENT DOCUMENTS

| | | |
|---|---|---|
| KR | 20090004172 A | 1/2009 |
| TW | 200901370 A | 1/2009 |
| TW | 201037854 A | 10/2010 |

\* cited by examiner

SELF-ALIGNED NANOWIRE FORMATION USING DOUBLE PATTERNING

PRIORITY CLAIM AND CROSS-REFERENCE

This application is a continuation of U.S. patent application Ser. No. 15/495,150, entitled "Self-Aligned Nanowire Formation Using Double Patterning," filed on Apr. 24, 2017, which is a divisional of U.S. patent application Ser. No. 14/289,167, entitled "Self-Aligned Nanowire Formation Using Double Patterning," filed on May 28, 2014, now U.S. Pat. No. 9,633,907, issued Apr. 25, 2017, which applications are incorporated herein by reference.

BACKGROUND

Double patterning is a technology developed for lithography to enhance feature density in integrated circuits. Typically, the lithography technology is used for forming features of integrated circuits on wafers. The lithography technology involves applying a photo resist, and defining patterns in the photo resist. The patterns in the photo resist are first defined in a lithography mask, and are implemented either by the transparent portions or by the opaque portions of the lithography mask. The patterns in the lithography mask are transferred to the photo resist through an exposure using the lithography mask, followed by the development of the photo resist. The patterns in the patterned photo resist are then transferred to the manufactured features, which are formed on a wafer.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The closely located features are separated to two masks of a same double-patterning mask set, with both masks used to form features that would have been formed using a single mask. In each of the masks, the distances between the features are increased over the distances between the features in the otherwise single mask, and hence the optical proximity effect is reduced, or substantially eliminated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
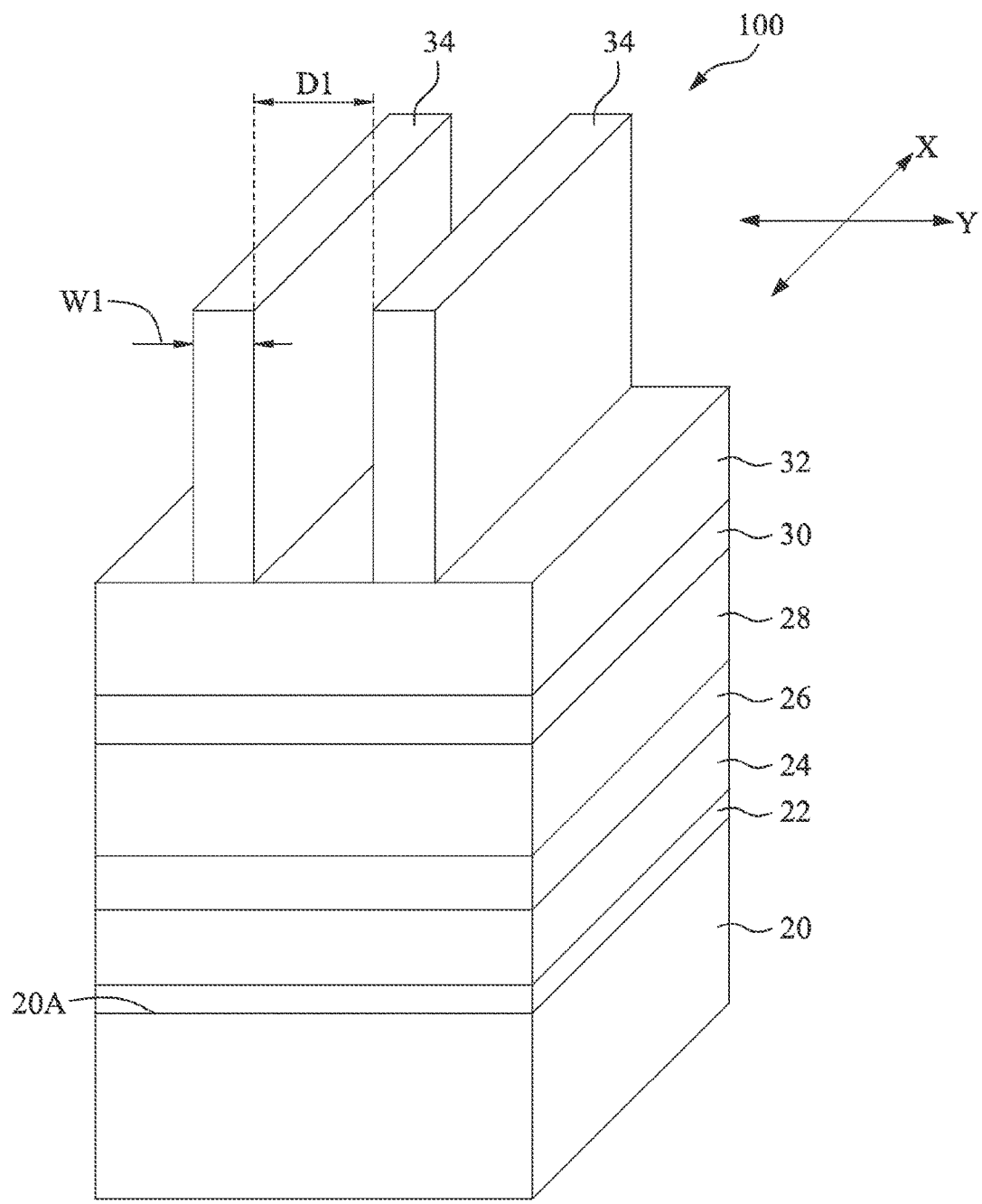
FIGS. 1 through 22B illustrate the perspective views and top views of intermediate stages in the formation of semiconductor nanowires in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor including nanowires and the method of forming the same are provided in accordance with various exemplary embodiments. The intermediate stages of forming the transistor are illustrated. The variations of the embodiments are discussed. Throughout the various views and illustrative embodiments, like reference numbers are used to designate like elements.

FIGS. 1 through 22B illustrate the perspective views and top views of intermediate stages in the formation of semiconductor nanowires in accordance with some embodiments. FIG. 1 illustrates wafer 100, which includes substrate 20 and overlying layers. Substrate 20 may be formed of a semiconductor material such as silicon, silicon germanium, a III-V compound semiconductor, or the like. In some embodiments, substrate 20 is a crystalline semiconductor substrate such as a crystalline silicon substrate. Pad dielectric layer 22 and hard mask 24 are formed over substrate 20. In accordance with embodiments, pad dielectric layer 22 is formed of a nitride such as silicon nitride, and hard mask 24 is formed of an oxide such as silicon oxide. In alternative embodiments, pad dielectric layer 22 is formed of an oxide such as silicon oxide, and hard mask 24 is formed of a nitride such as silicon nitride. In yet other embodiments, pad dielectric layer 22 and hard mask 24 are formed of different materials selected from the materials including, and not limited to, silicon carbide, silicon oxynitride, silicon oxide, and silicon nitride, providing pad dielectric layer 22 and hard mask 24 are formed of different materials that have a high etching selectivity.

A plurality of layers is formed over hard mask 24. In some exemplary embodiments, the plurality of layers includes nitride layer 26 over hard mask 24, amorphous silicon layer 28 over nitride layer 26, oxide layer 30 over amorphous silicon layer 28, and amorphous silicon layer 32 over oxide layer 30. Throughout the description, amorphous silicon layer 32 is also referred to as a pattern-reservation layer since it is used to temporarily preserve a pattern of nanowires. Nitride layer 26 may comprise silicon nitride in accordance with some embodiments, while other dielectric layers different from the overlying material (such as amorphous silicon) and the underlying material (such as oxide) may also be used. It is appreciated that the layers illustrated in FIG. 1 is exemplary. In alternative embodiments, different layers may be formed over substrate 20, and the number of layers may also be different from what is shown in FIG. 1.

In accordance with some embodiments, photo resist 34 is formed over amorphous silicon layer 32, and is then patterned. In alternative embodiments, instead of forming a single photo resist 34, a double layer or a tri-layer is formed. For example, photo resist 34 may be replaced with a tri-layer (not shown), which includes an under layer, a middle layer over the under layer, and upper layer over the middle layer. In some embodiments, the under layer and the upper layer may be formed of photo resists, which are organic materials. The middle layer may include the mix of silicon and an inorganic material. The middle layer has a high etching selectivity with relative to the upper layer and the under layer, and hence the upper layer may be used as the etching mask for the patterning of the middle layer, and the middle layer may be used as the etching mask for the patterning of the under layer.

After the patterning, photo resist 34 includes a plurality of photo resist strips (also referred to using reference notation 34) having lengthwise directions in the X direction, which is a horizontal direction that is also parallel to the major surface 20A of substrate 20. FIG. 1 also illustrates the Y direction that is in the same horizontal plane as the X direction, wherein the X direction and the Y direction are perpendicular to each other. The plurality of photo resist strips 34 is parallel to each other, and may have equal widths W1 and equal distances D1. In some embodiments, width W1 and distance D1 are close to, or equal to, the minimum width and distance allowed by the technology for developing photo resist 34. Width W and distance D1 may be equal to each other or different from each other.

Figure 2:
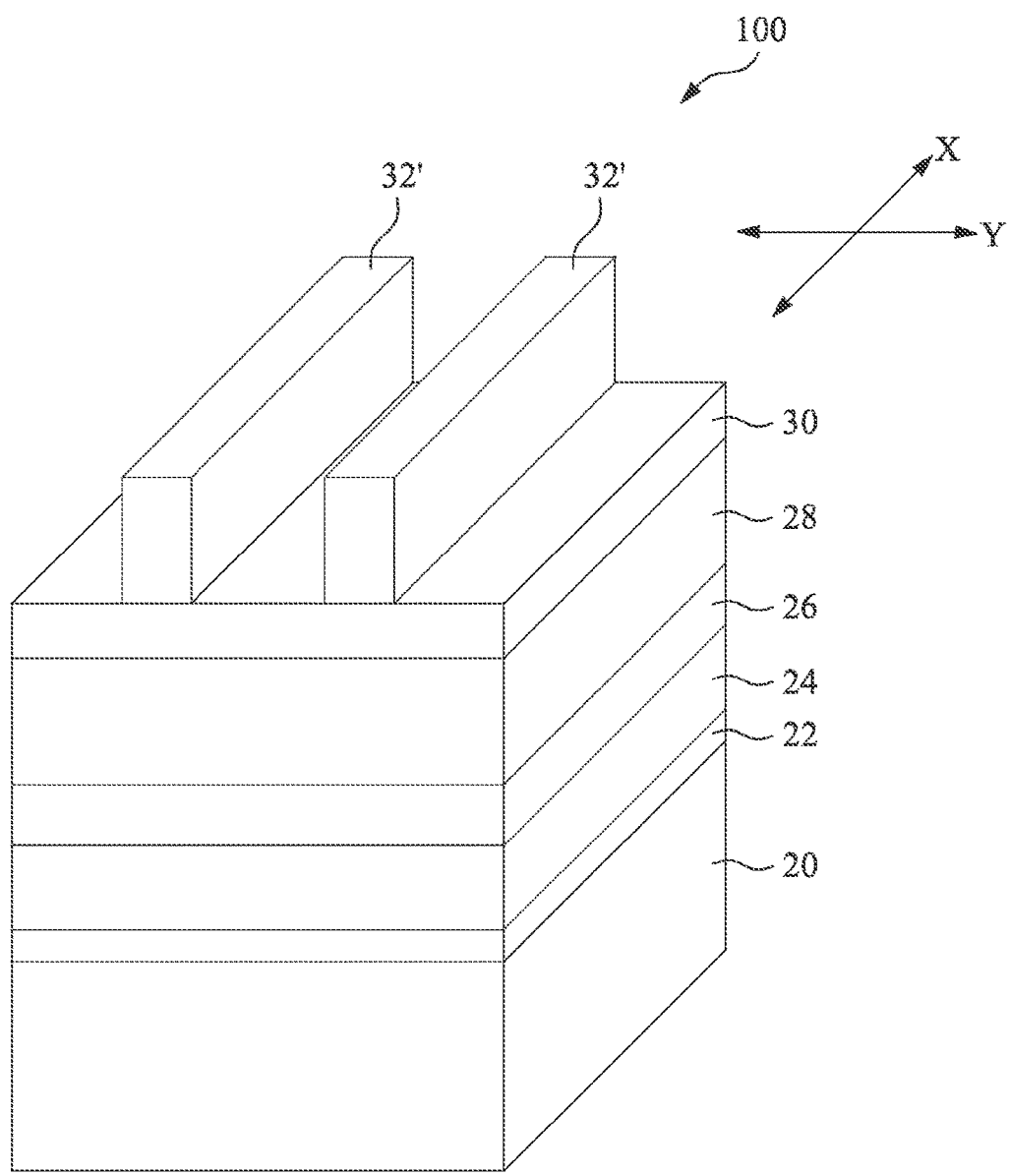

A pattering process is the performed using photo resist strips 34 as an etching mask. As a result, amorphous silicon layer 32 is patterned, resulting in amorphous silicon strips 32' as shown in FIG. 2. Silicon strips 32' have lengthwise directions extending in the X direction. Amorphous silicon strips 32' act as mandrels in the subsequent processes. Photo resist strips 34 are either consumed during the patterning of amorphous silicon layer 32 or removed after the patterning of amorphous silicon layer 32.

Figure 3:
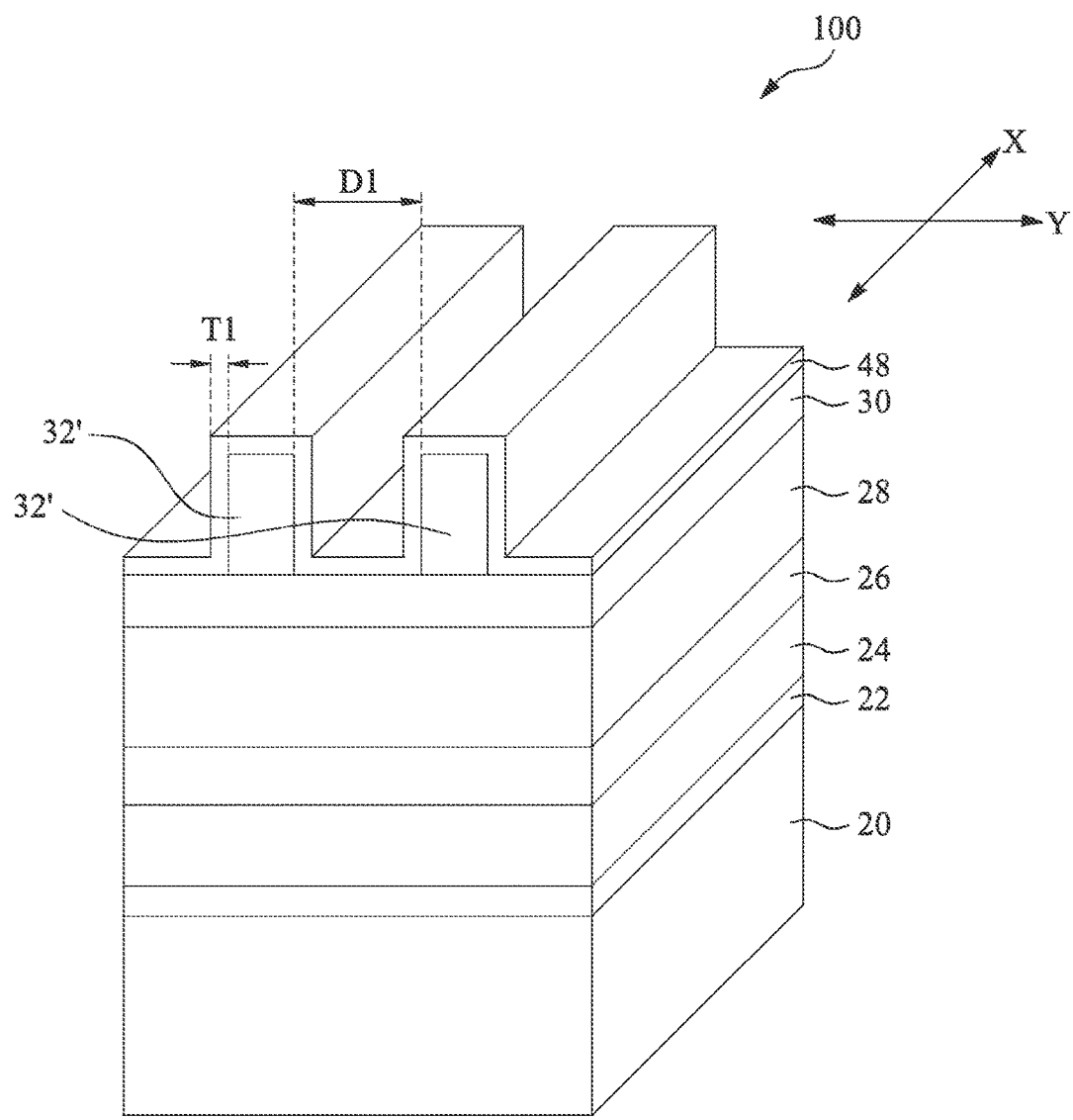

Next, as shown in FIG. 3, spacer layer 48 is deposited using a conformal deposition method. In some embodiments, spacer layer 48 is deposited using Atomic Layer Deposition (ALD), which forms spacer layer 48 as a high quality film that has a low etching rate. The ALD may be performed using DiChloroSilane (DCS) and ammonia as precursors, and the resulting spacer layer 48 includes silicon nitride or silicon-rich nitride. In alternative embodiments, other conformal deposition methods such as Low-Pressure Chemical Vapor Deposition (LPCVD) may be performed. Thickness T1 of spacer layer 48 is smaller than a half of, and may be close to about a third of, distance D1 in some exemplary embodiments.

Figure 4:
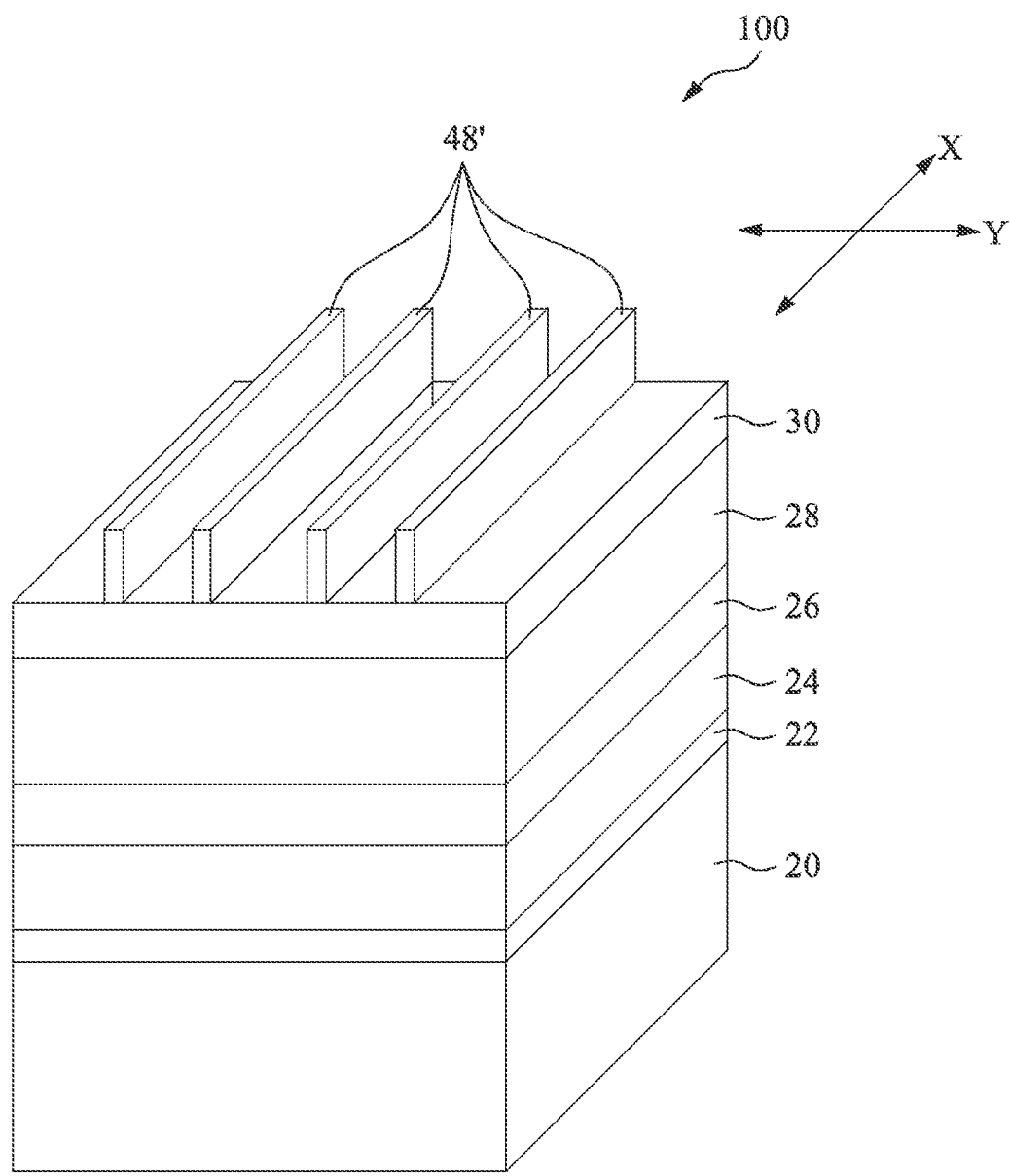

Referring to FIG. 4, the horizontal portions of spacer layer 48 as in FIG. 3 are removed, for example, through an anisotropic etching step. The vertical portions of spacer layer 48 are left, and are referred to as spacers 48' hereinafter. Spacers 48' also have lengthwise directions in the X direction. Next, amorphous silicon strips 32' (FIG. 3) are removed in an etching step, and spacers 48' remain.

Figure 5:
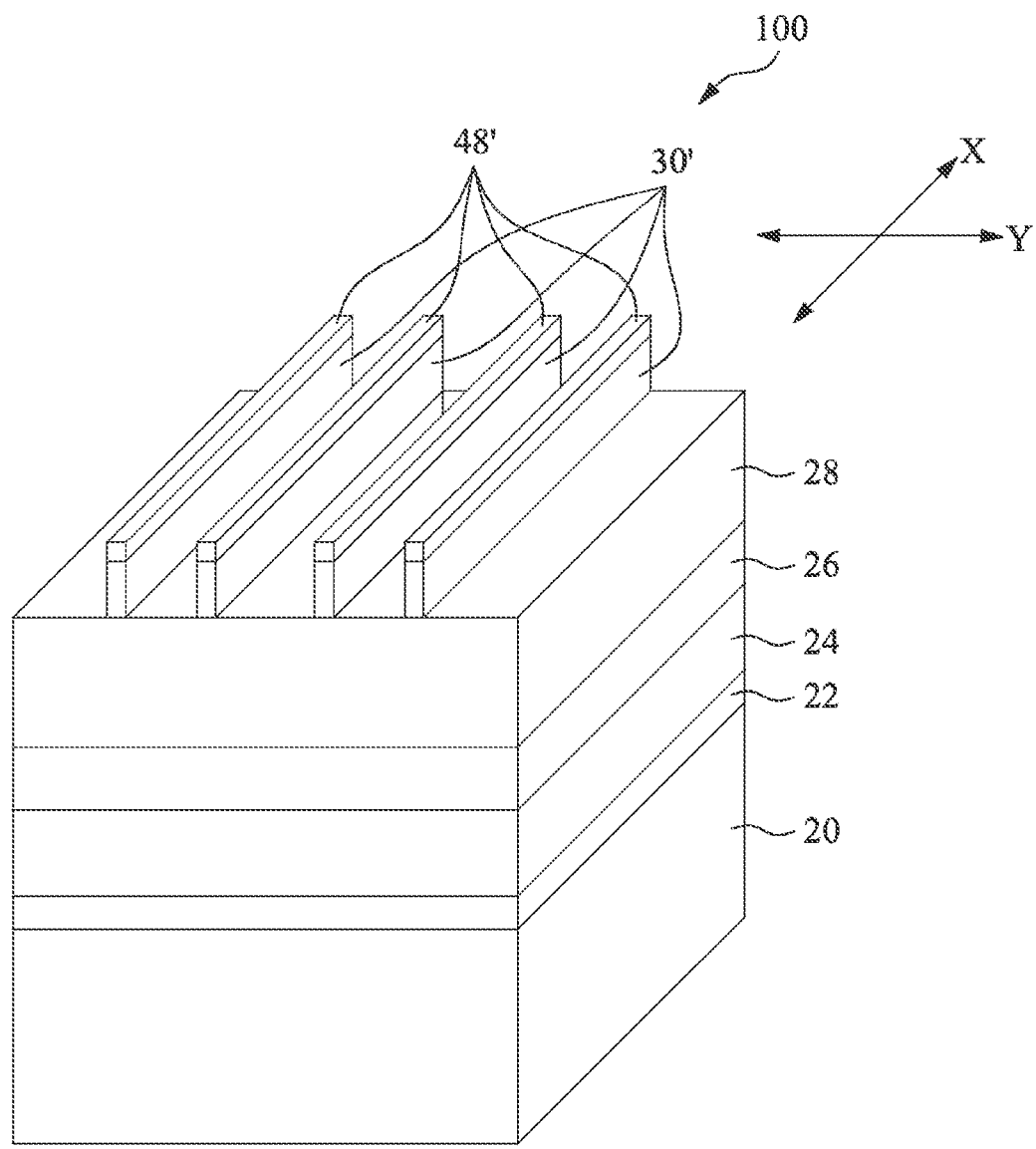
Figure 6:
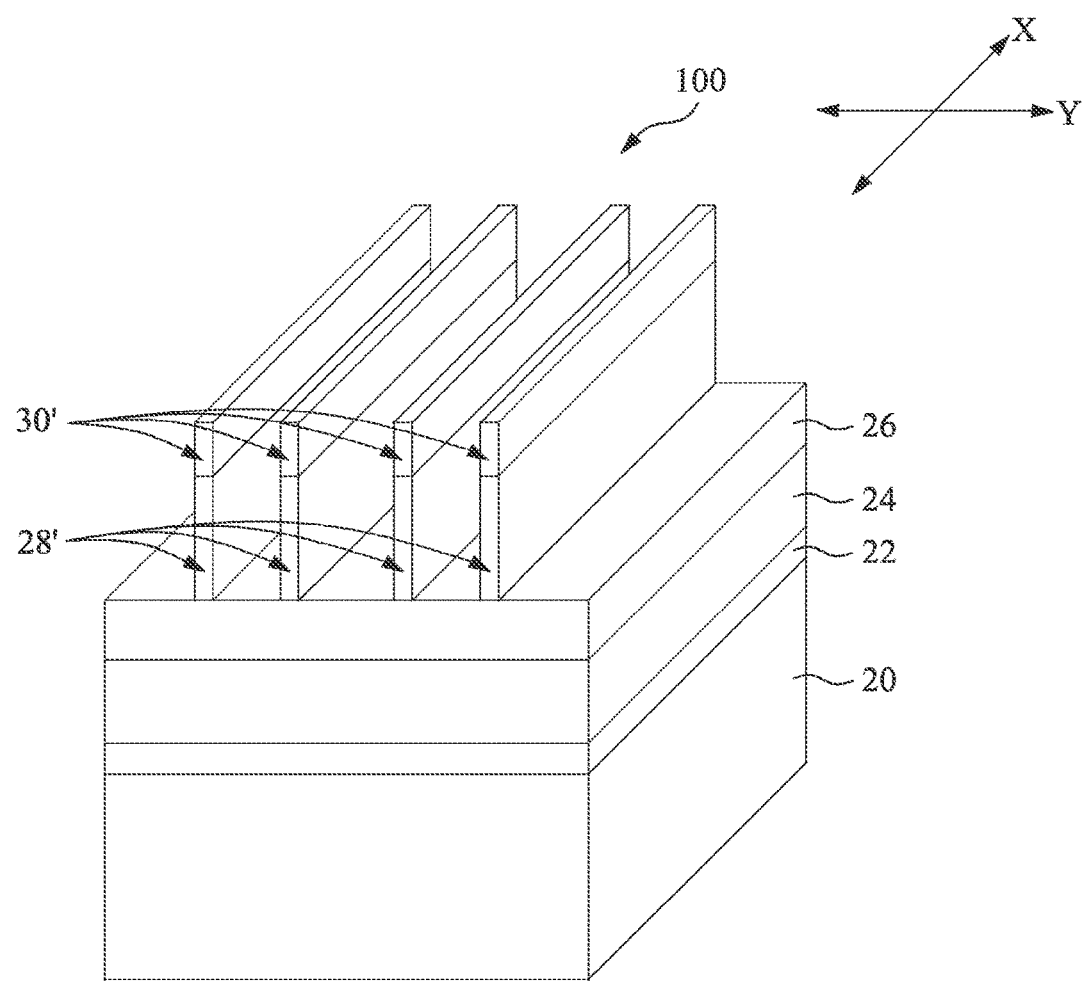
Figure 14B:
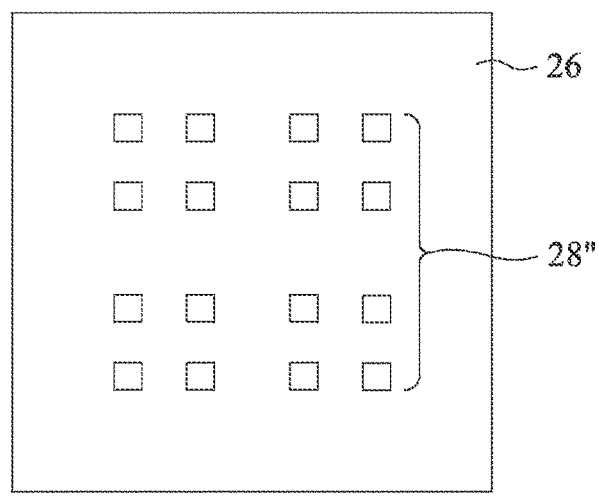
Figure 14A:
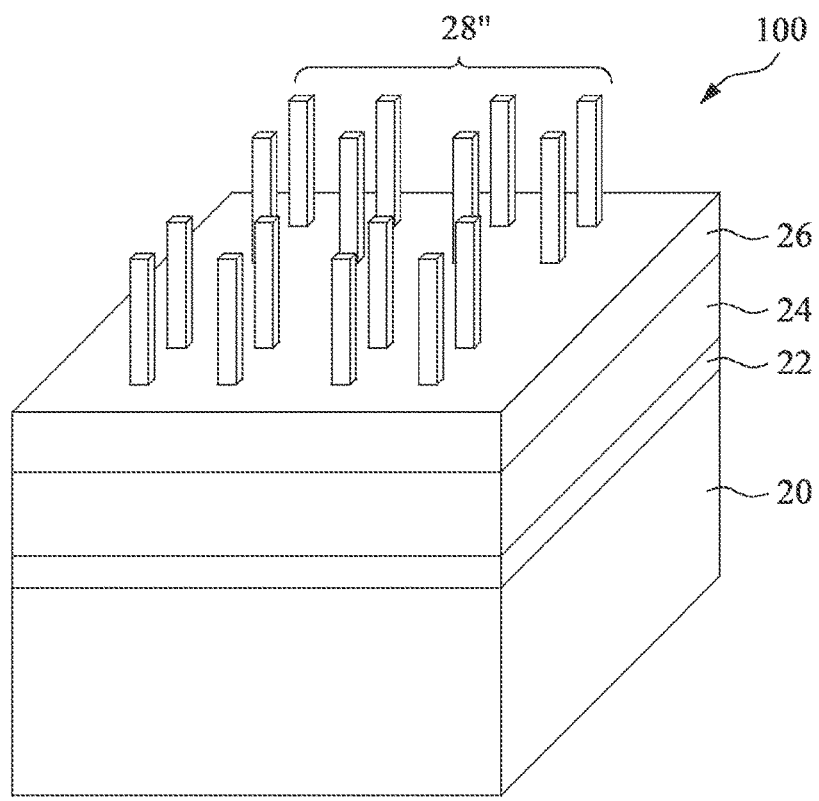

Next, referring to FIG. 5, oxide layer 30 (FIG. 4) is etched using spacers 48' as an etching mask, resulting in oxide strips 30'. During the etching process, spacers 48' are partially or fully consumed. Next, oxide strips 30' (and spacers 48' if not fully consumed yet) are used as an etching mask to etch the underlying amorphous silicon layer 28, and the resulting structure is shown in FIG. 6. The remaining portions of amorphous silicon layer 28 include a plurality of amorphous silicon strips 28' having lengthwise directions in the X direction. In some embodiments, after the formation of silicon strips 28', oxide strips 30' have portions remaining over amorphous silicon strips 28' to ensure that the thickness of amorphous silicon strips 28' is not reduced during its patterning. In alternative embodiments, oxide strips 30' are fully consumed after the formation of amorphous silicon strips 28'. In these embodiments, however, the thickness of amorphous silicon strips 28' is substantially not reduced. Otherwise, the nanowires 28' as shown in FIG. 14A may not have enough height for the patterning of substrate 20.

The steps illustrated in FIGS. 1 through 4 are referred to as a first self-aligned multi-patterning process since the patterns of spacers 48' are self-aligned to the patterns of photo resist strips 34 (FIG. 1), and the number of spacers 48' is doubled compared to the number of photo resist strips 34. The multi-patterning process may be a double patterning process (as illustrated in the exemplary embodiments). In alternative embodiments, multi-patterning process may be a triple-patterning process, a quadruple-patterning process, etc.

Figure 7:
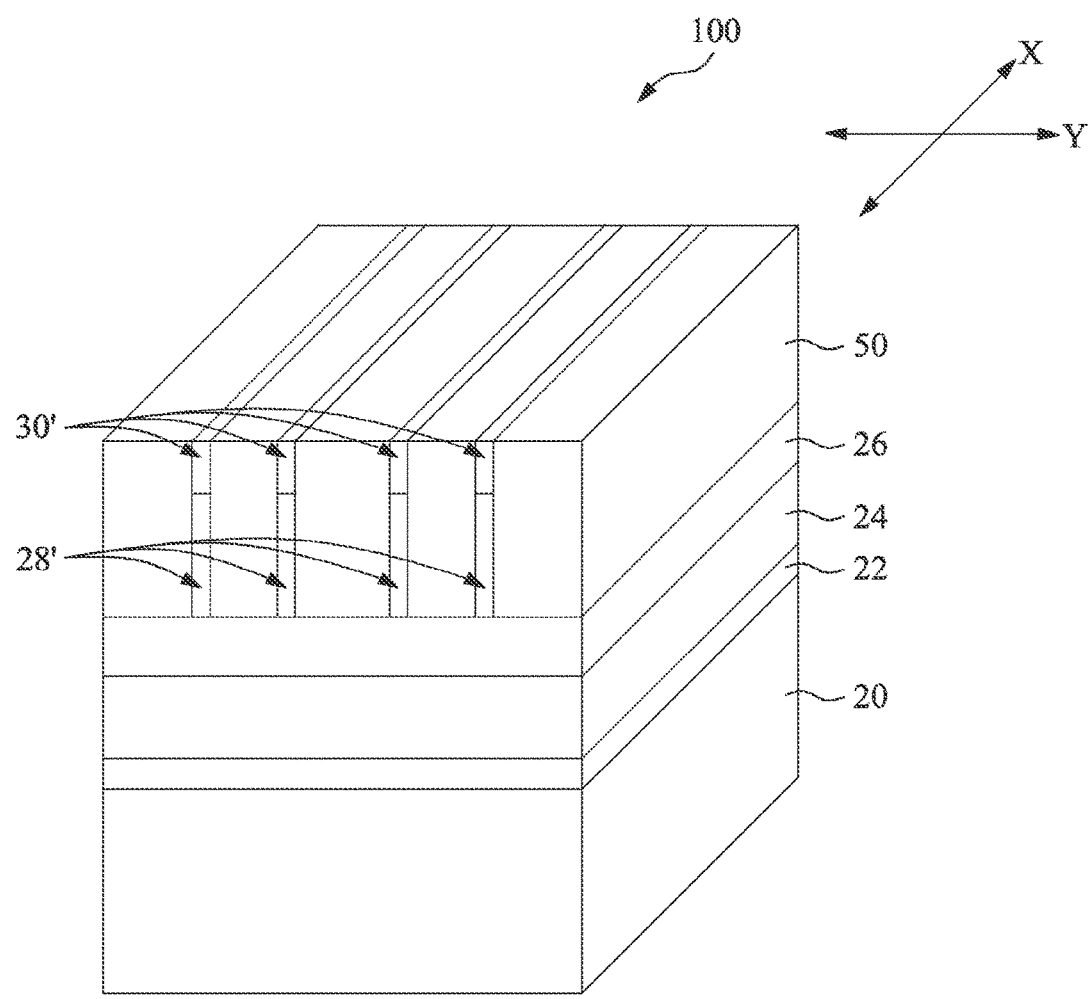

FIGS. 7 through 13 illustrate a second self-aligned multi-patterning process to further pattern amorphous silicon strips 28' as nanowires. Referring to FIG. 7, filling material 50 is formed to fill the spaces between amorphous silicon strips 28'. The top surface of filling material 50 is higher than the top surface of amorphous silicon strips 28', and may be higher than or level with the top surfaces of oxide strips 30'. In some exemplary embodiments, filling material 50 comprises a flowable oxide, which may be formed using Flowable Chemical Vapor Deposition (FCVD). Filling material 50 may also be silicon oxide. In alternative embodiments, spin-on coating may be used to form filling material 50. The top surface of filling material 50 is leveled, for example, by adopting a Chemical Mechanical Polish (CMP).

Figure 8:
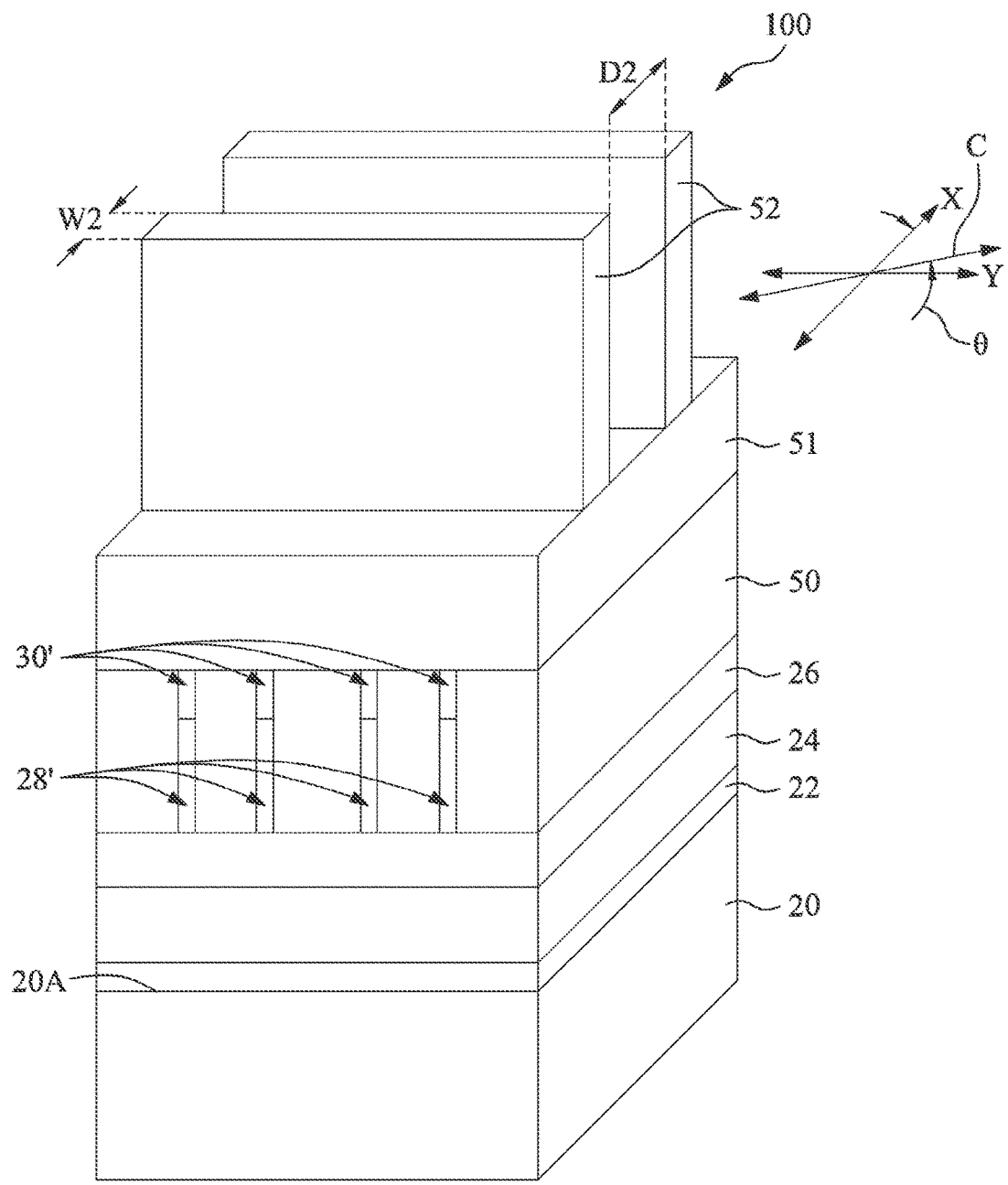

Next, as shown in FIG. 8, amorphous silicon layer 51 is formed over filling material 50, followed by the formation of photo resist strips 52. Photo resist strips 52 have a lengthwise direction. In some embodiments, the lengthwise direction of photo resist strips 52 is in the Y direction that is perpendicular to the X direction. The Y direction is a horizontal direction parallel to major surface 20A of substrate 20. In alternative embodiments, the lengthwise direction of photo resist strips 52 is in direction C, which is neither parallel nor perpendicular to either of the X direction and the Y direction. The C direction and the X direction form angle θ, which is between, and not equal to, 0 degree and 90 degrees.

The plurality of photo resist strips 52 is parallel to each other, and may have equal widths W2 and equal distances D2. In some embodiments, width W2 and distance D2 are close to, or equal to, the minimum width and distance allowed by the technology for developing photo resist strips 52. Width W2 and distance D2 may be equal to each other or different from each other. Furthermore, widths W1 (FIG. 1) and W2 (FIG. 8) may be equal to (or different from) each other, and distances D1 (FIG. 1) and D2 (FIG. 8) may be equal to (or different from) each other.

Figure 9:
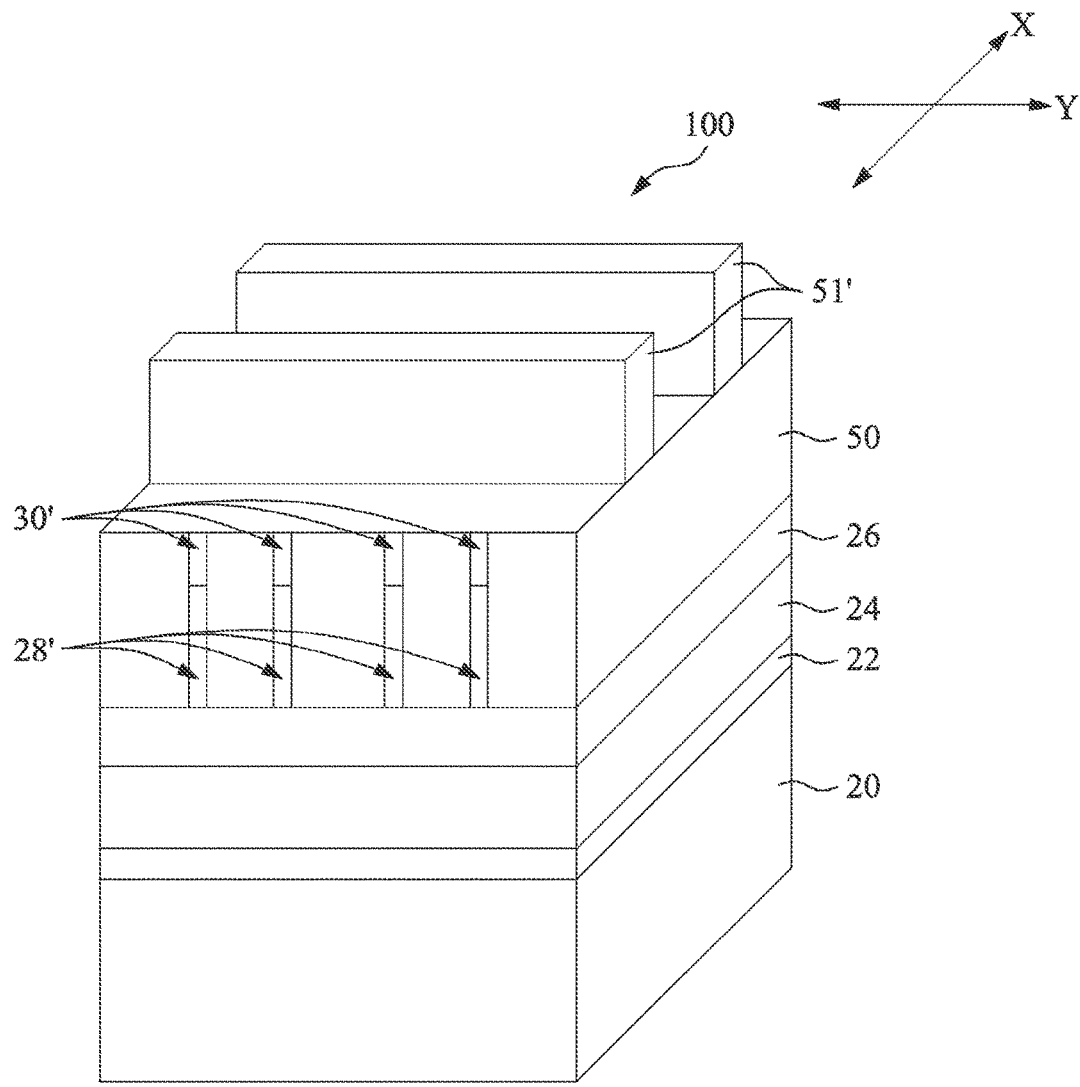
Figure 10:
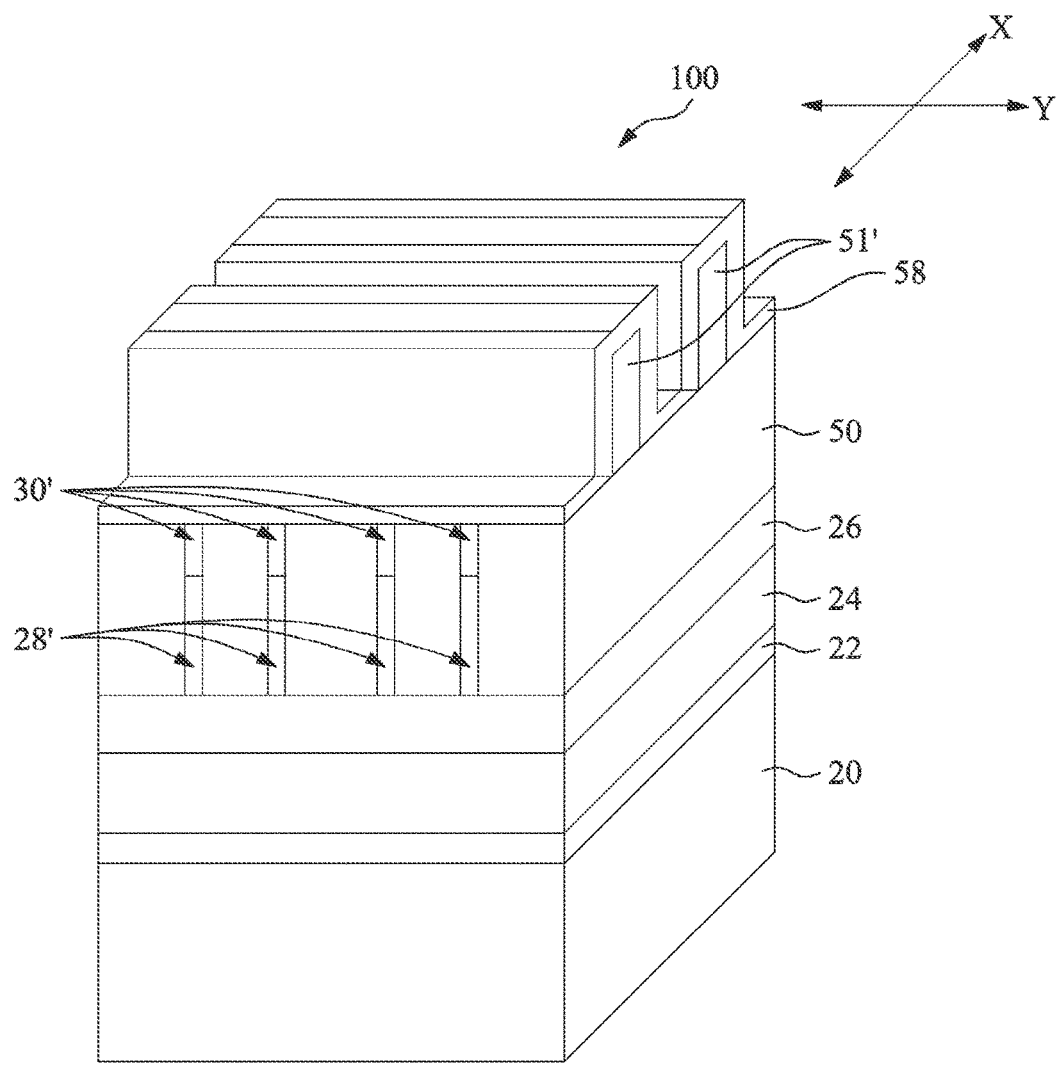
Figure 11:
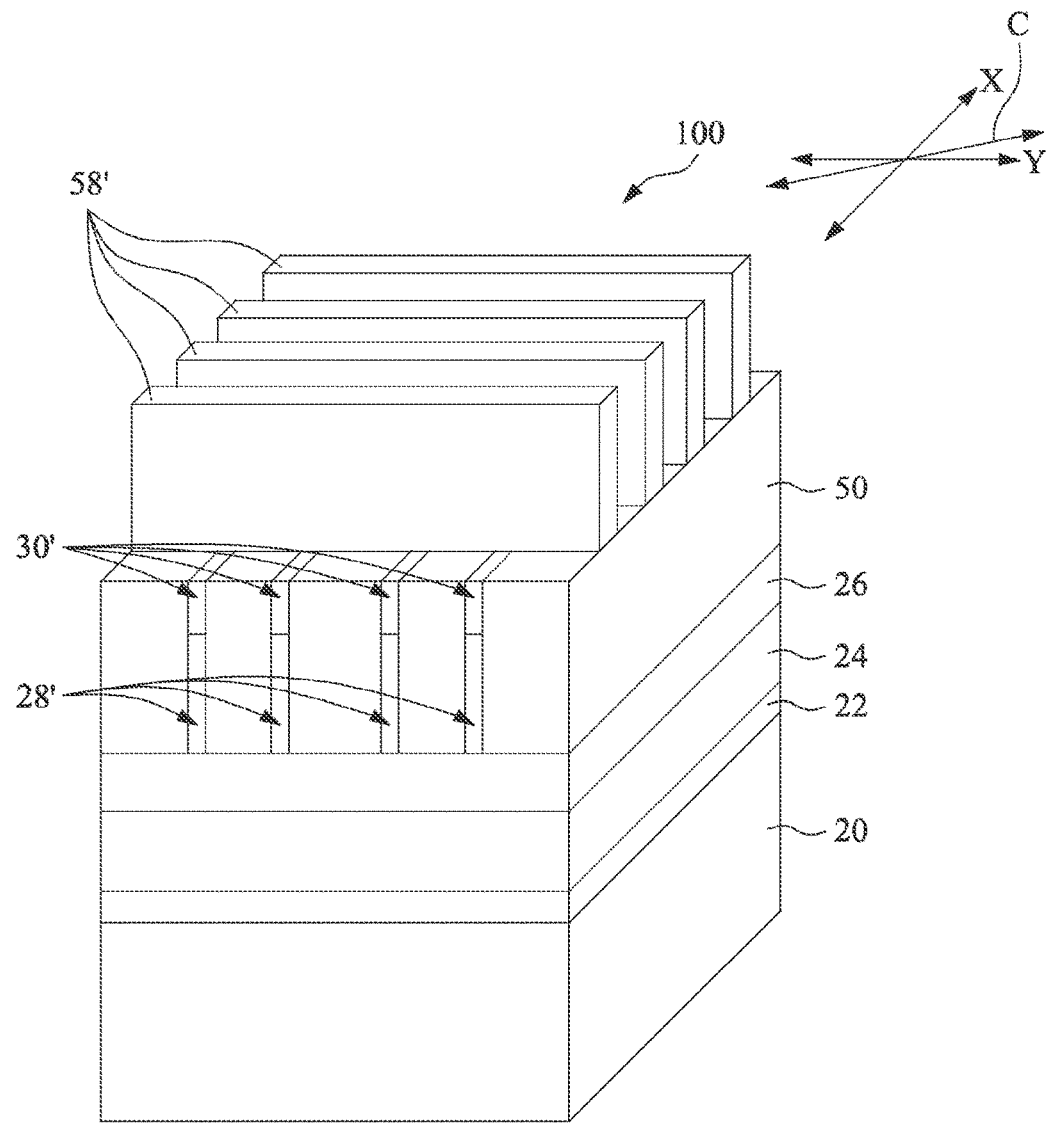

Next, amorphous silicon layer 51 is patterned using photo resist strips 52 as an etching mask. Amorphous silicon strips 51' are thus formed, as shown in FIG. 9. The patterning stops on filling material 50 and oxide strips 30'. Photo resist strips 52 are consumed, at least partially, during the patterning. The subsequent steps as shown in FIGS. 10 and 11 are similar to what are shown in FIGS. 3 and 4, respectively. In FIG. 10, spacer layer 58 is formed on the top surfaces and the sidewalls of amorphous silicon strips 51'. Spacer layer 58 may be essentially the same as spacer layer 48, as shown in FIG. 3.

Next, the horizontal portions of spacer layer 58 are removed, leaving spacers 58', as shown in FIG. 11. Spacers 58' have lengthwise directions in the C direction or the Y direction. Amorphous silicon strips 51' (FIG. 10) are also removed, and hence are hence referred to as mandrels hereinafter.

Figure 12:
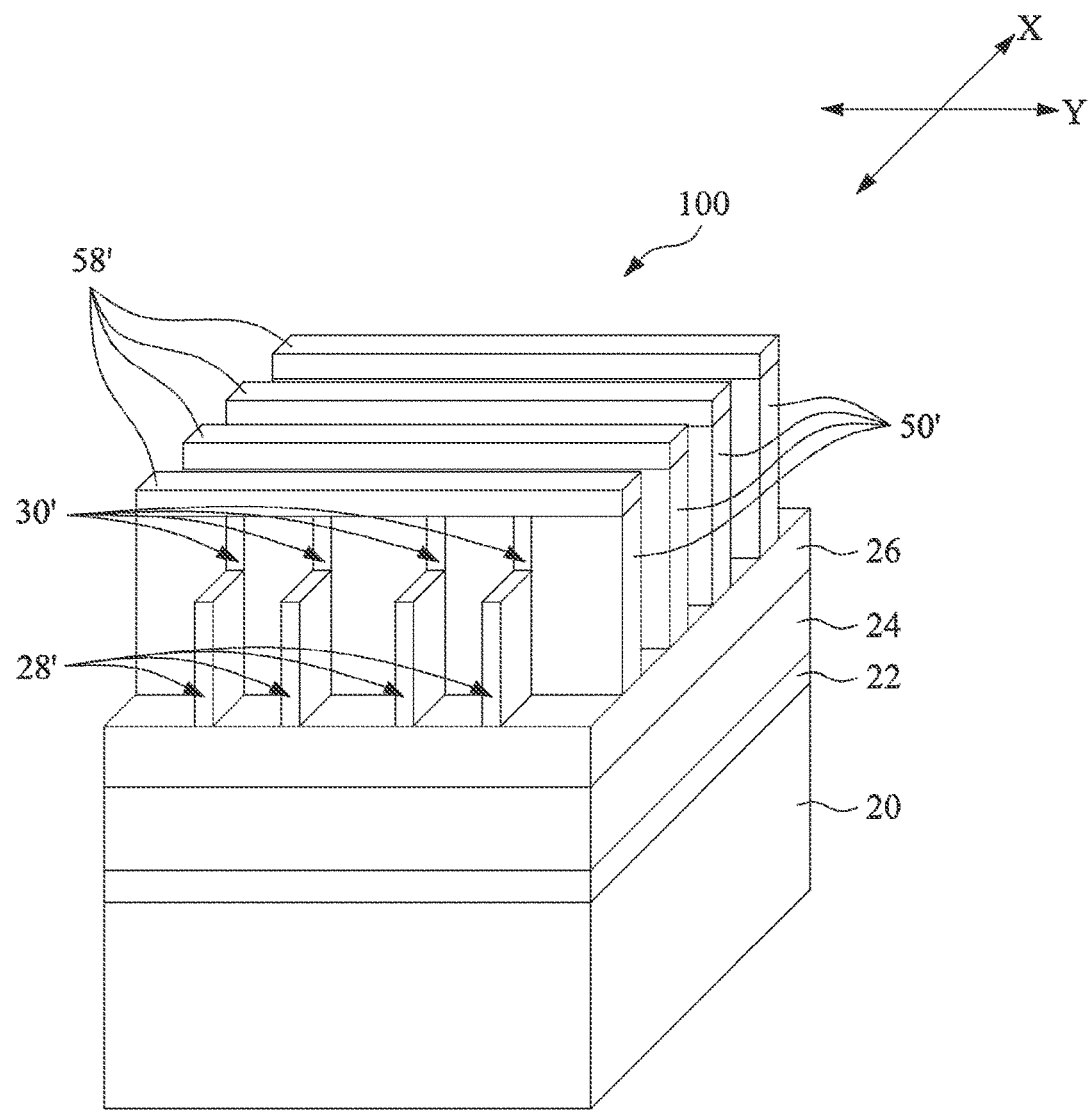

FIG. 12 illustrates the patterning of oxide strips 30' and filling material 50 using spacers 58' as an etching mask. The patterning stops on layer 26, which is used as an etch stop layer. Amorphous silicon strips 28' have some portions covered by the remaining portions of oxide strips 30' and filling material 50, and some other portions not covered by the remaining portions of oxide strips 30' and filling material 50. Spacers 58' are consumed, at least partially, and possibly fully, during the patterning of oxide strips 30' and filling material 50.

Figure 13:
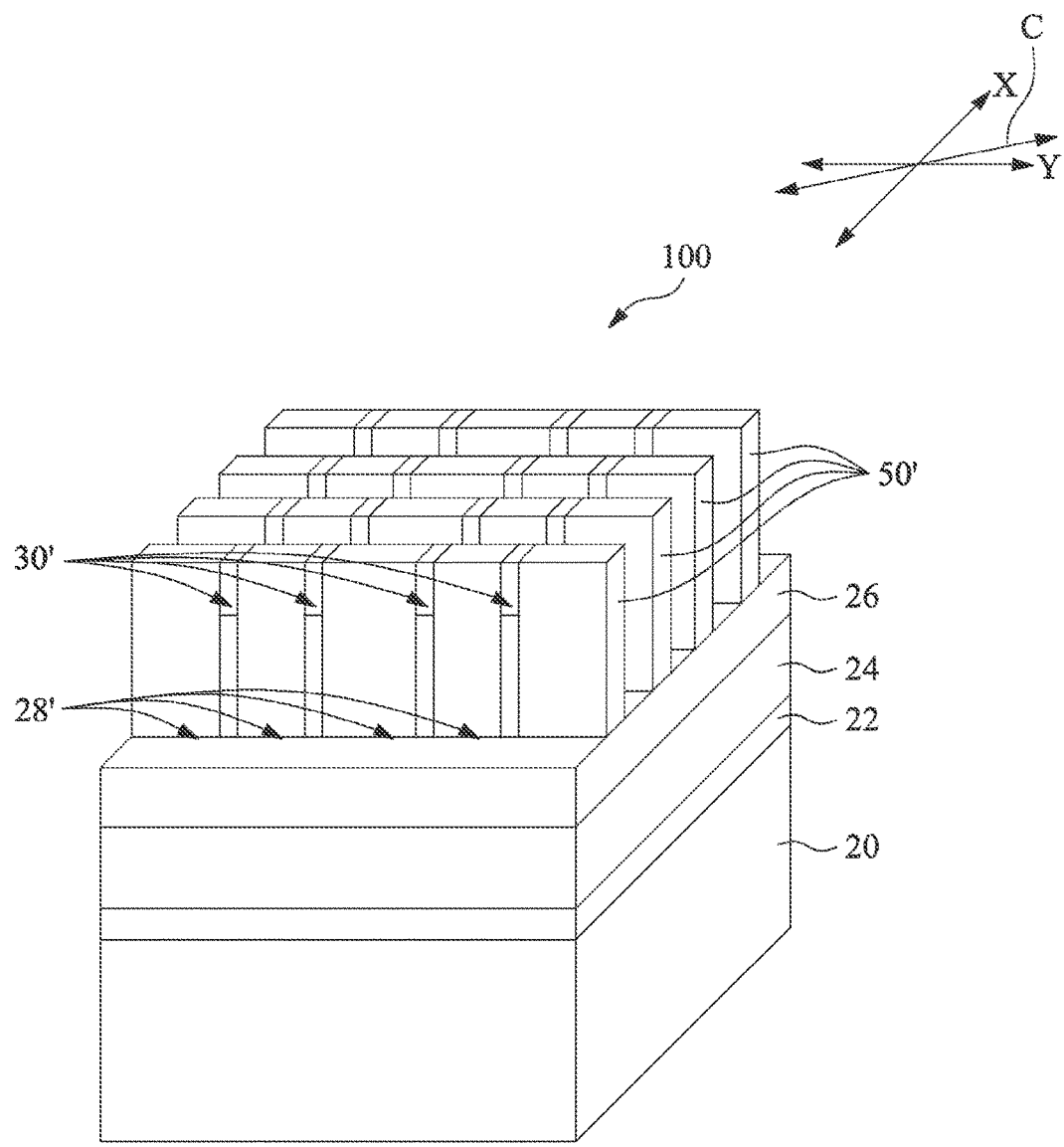

Next, as shown in FIG. 13, the remaining portions of oxide strips 30' and filling material 50 are used as an etching mask to etch amorphous silicon strips 28'. As a result, a plurality of strips are formed extending in the C direction or the Y direction, with each of the strips including the remaining portions of oxide strips 30', amorphous silicon strips 28', and filling material 50.

As shown in FIGS. 6 and 13, amorphous silicon layer 28 (FIG. 1) was patterned twice in two self-aligned double patterning steps, once in the X direction (FIG. 6), and once in the C direction or the Y direction (FIG. 13). Accordingly, the remaining portions of amorphous silicon strips 28' form a plurality of nanowires. The remaining portions of oxide strips 30' and filling material 50 are then removed. FIGS. 14A and 14B illustrate a perspective view and a top view illustrating the resulting nanowires 28'' after the remaining portions of oxide strips 30' and filling material 50 are removed.

Figure 15B:
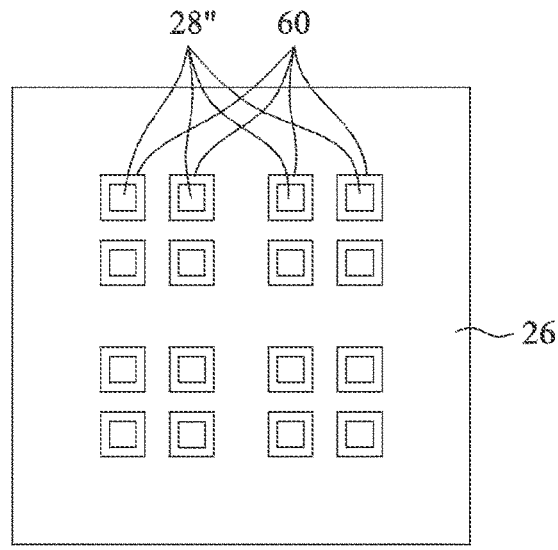
Figure 15A:
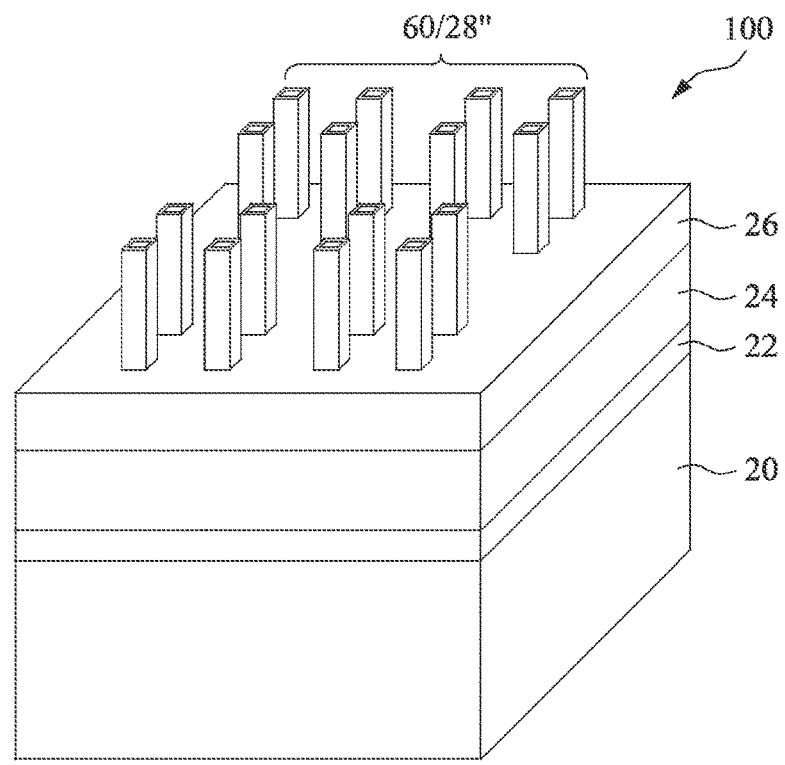
Figure 16B:
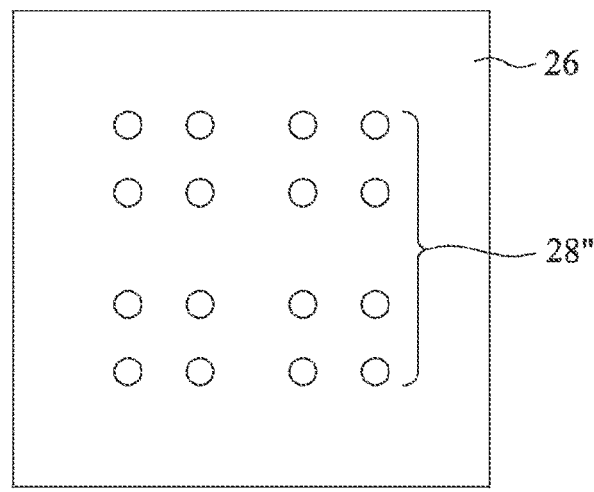
Figure 16A:
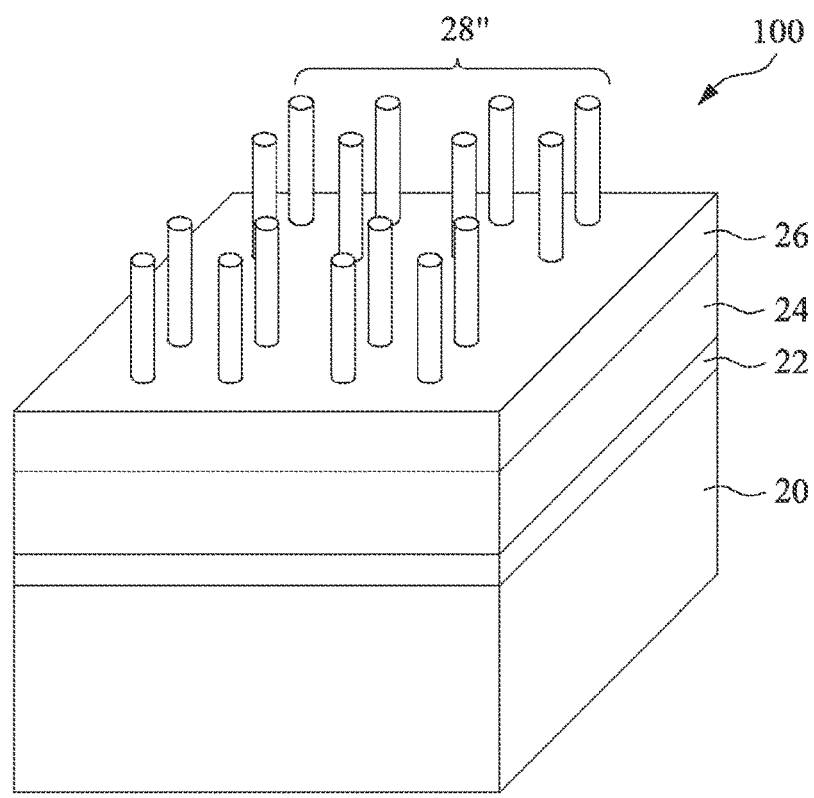
Figure 17B:
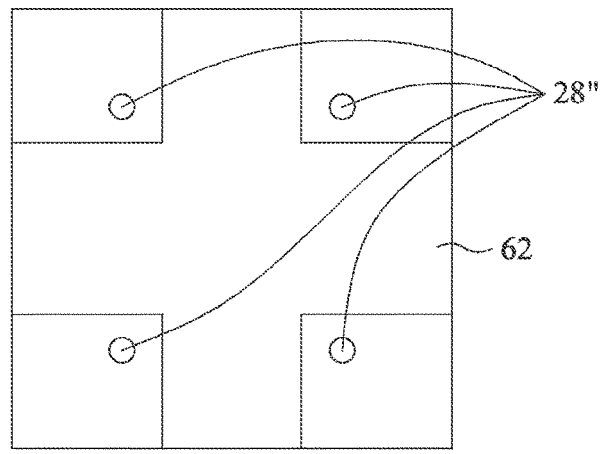
Figure 17A:
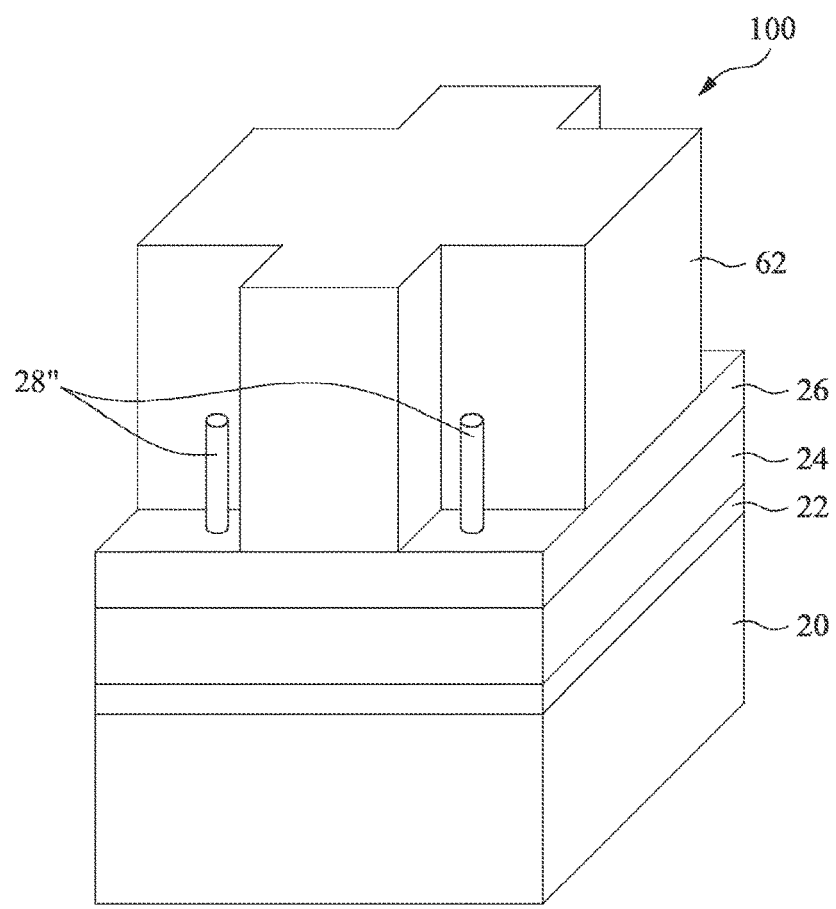

FIGS. 15A through 16B illustrate the thinning and rounding of nanowires 28'' in accordance with some exemplary embodiments. Referring to FIGS. 15A (a perspective view) and 15B (a top view), an oxidation is performed to oxidize the outer portions of nanowires 28''. Accordingly, oxide layers 60 are formed to surround, and on the top surface of, the remaining inner portions of nanowires 28''. Since the oxidation rate at the corners is higher than the oxidation rate on flat surfaces of nanowires 28'', the resulting nanowires 28'' are more rounded. FIGS. 16A and 16B illustrate a perspective view and a top view, respectively, of the resulting nanowires 28'' after the removal of oxide layers 60. In alternative embodiments, the steps in FIGS. 15A through 16B are skipped.

Figure 18B:
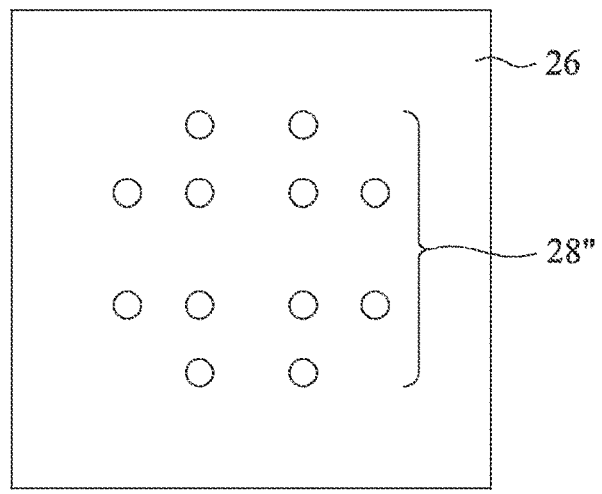
Figure 18A:
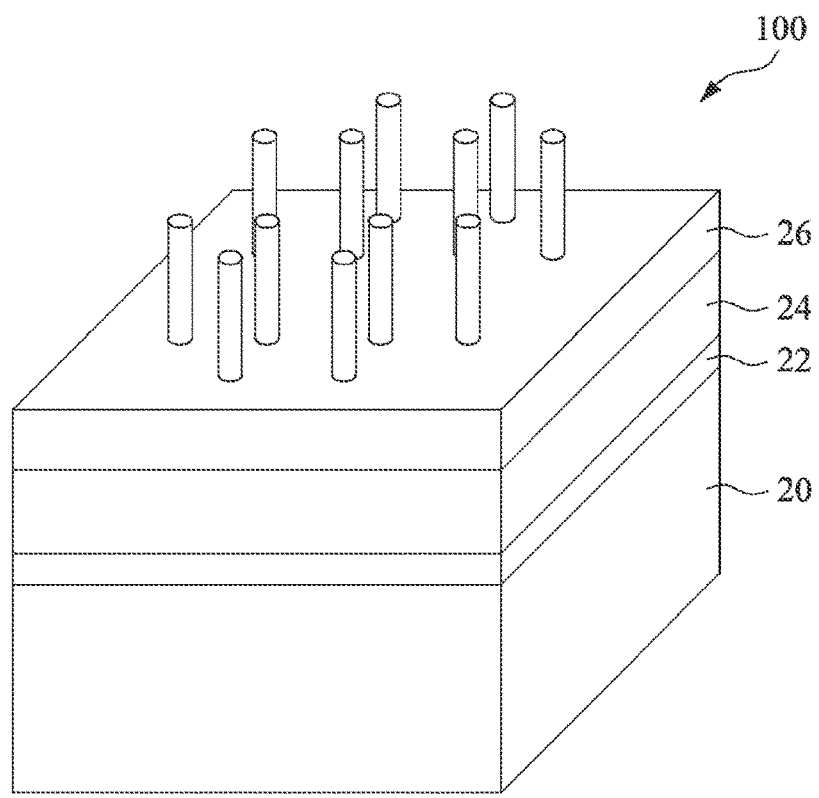

FIGS. 17A through 18B illustrate the removal of some undesirable nanowires 28'' in accordance with some embodiments. For example, in FIGS. 17A and 17B, which illustrate a perspective view and a top view, respectively, photo resist 62 is formed to cover some of nanowires 28'', while leaving some other nanowires 28'' not covered. The un-covered nanowires 28'' are then etched, followed by the removal of photo resist 62. The resulting structure is shown in FIGS. 18A and 18B, which illustrate a perspective view and a top view, respectively.

Figure 19B:
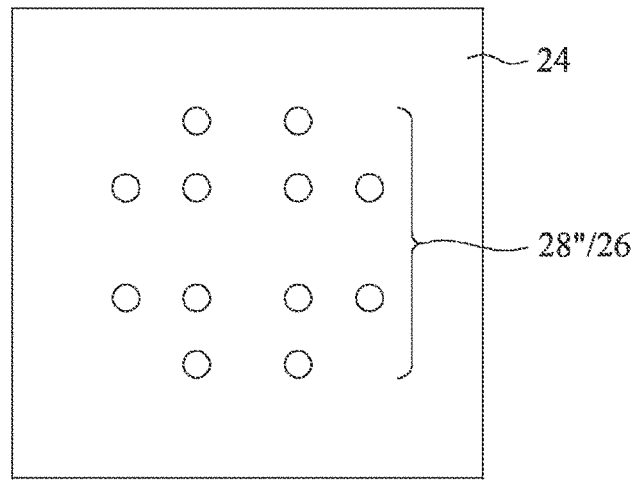
Figure 19A:
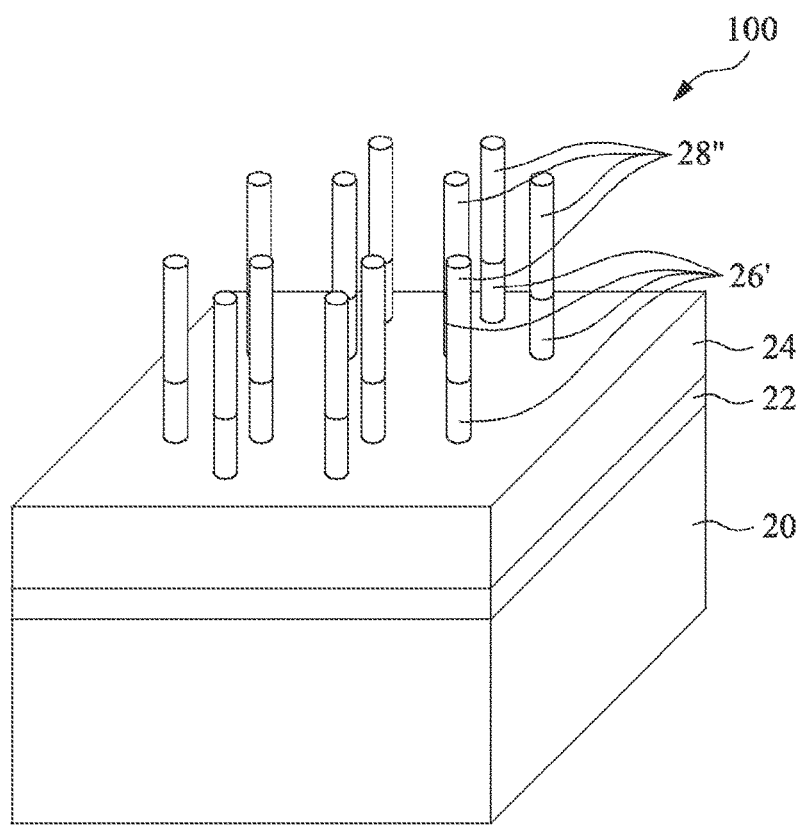
Figure 20B:
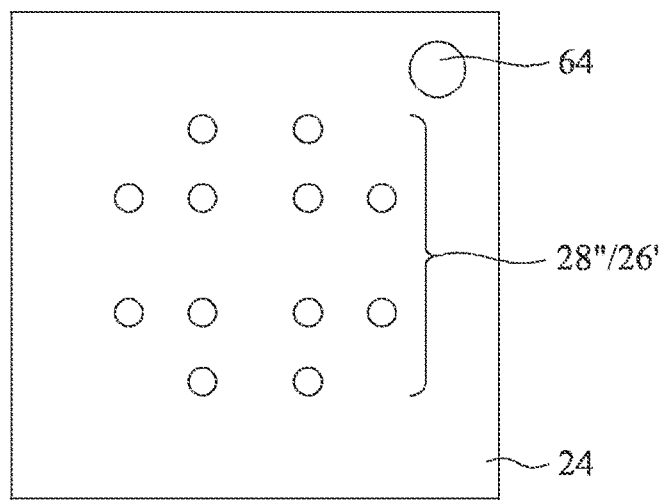
Figure 20A:
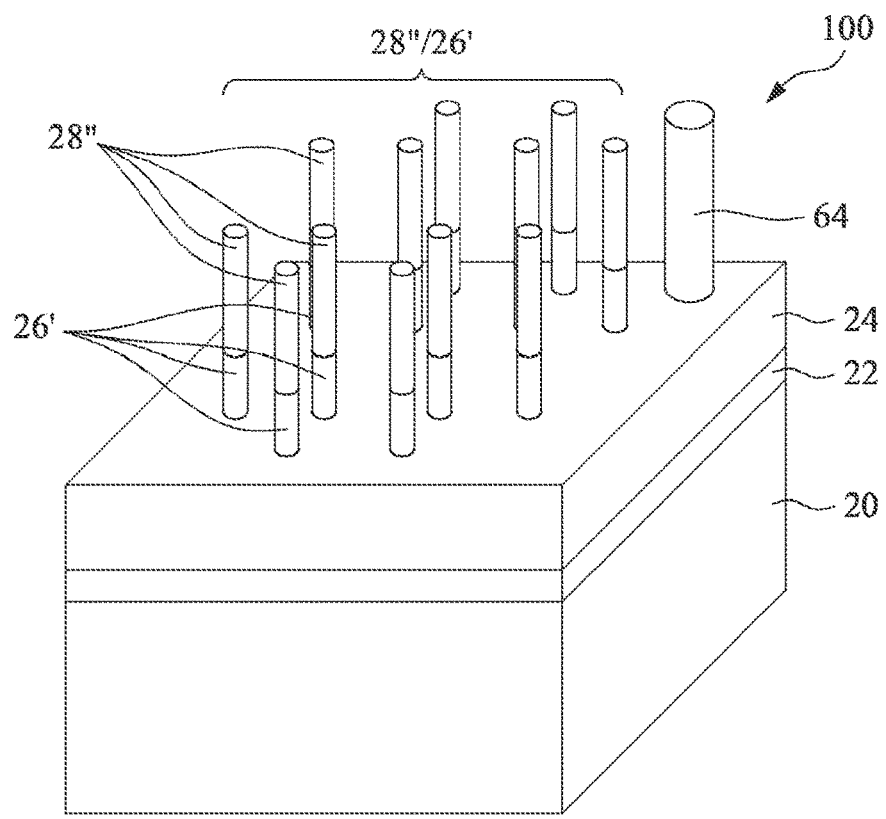

Referring to FIGS. 19A and 19B, which illustrate a perspective view and a top view, respectively, nanowires 28'' are used as an etching mask to etch the underlying nitride layer 26, so that nanowires 26' are formed. Next, as shown in FIGS. 20A and 20B, respectively, a large photo resist 64 is formed over hard mask 24. Large photo resist 64 is used to form patterns that are larger than nanowires 28'' since nanowires 26' and 28'' may have a uniform size.

Figure 21B:
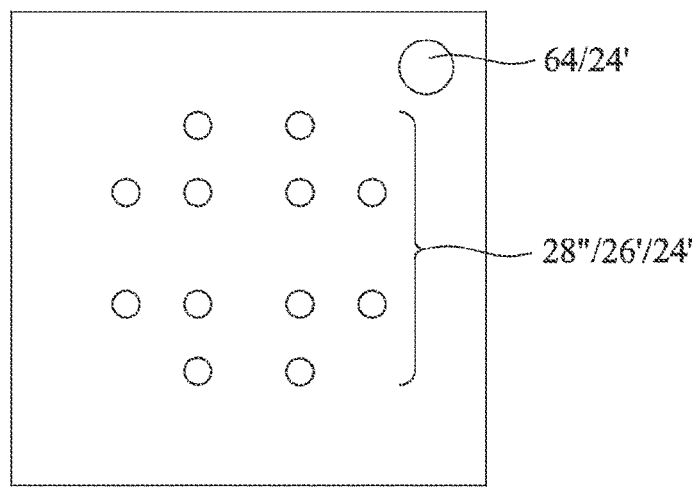
Figure 21A:
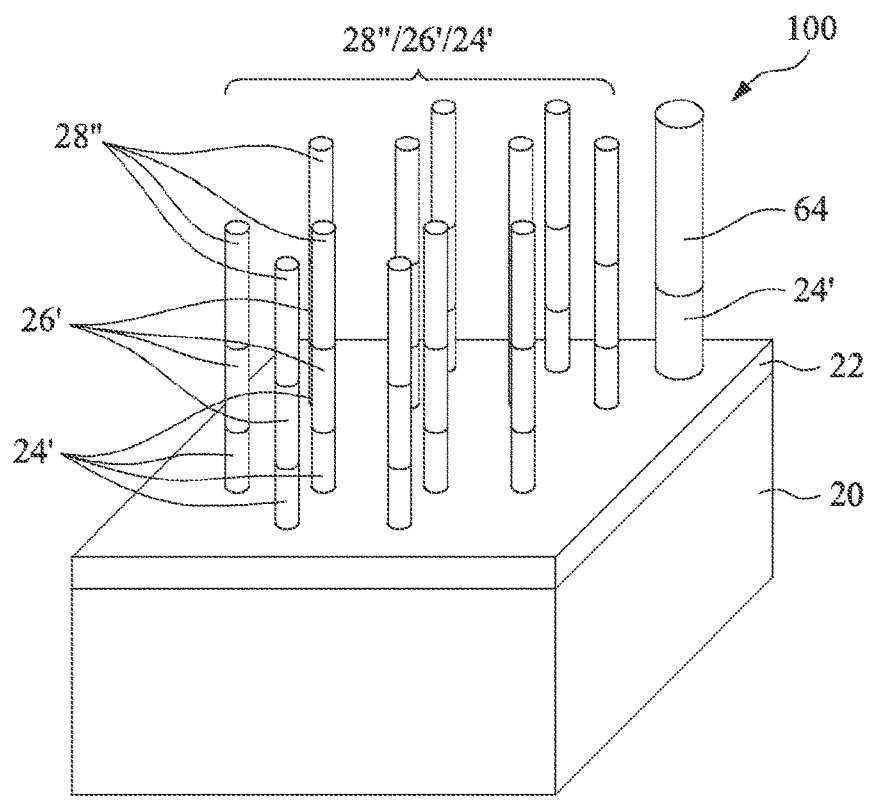

In a subsequent step, the patterns of nanowires 28'', nanowires 26', and photo resist 64 are transferred into hard mask 24 by etching. The resulting structure is shown in FIGS. 21A and 21B, which illustrate a perspective view and a top view, respectively. Nanowires 24' are thus formed to include the remaining portions of hard mask 24.

Figure 22B:
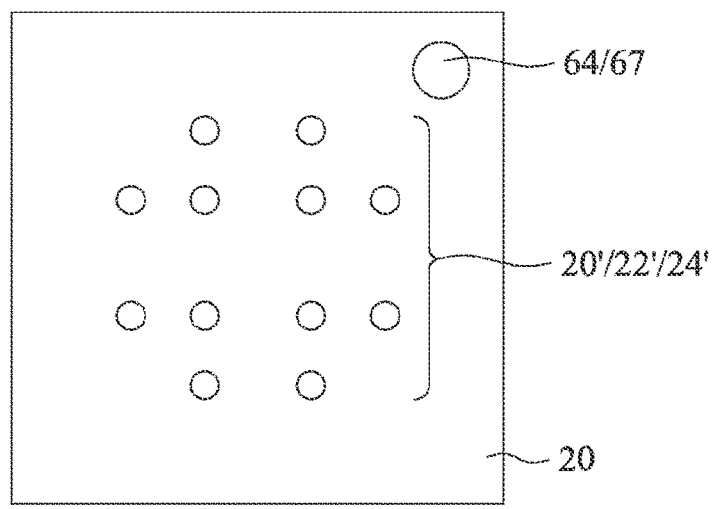
Figure 22A:
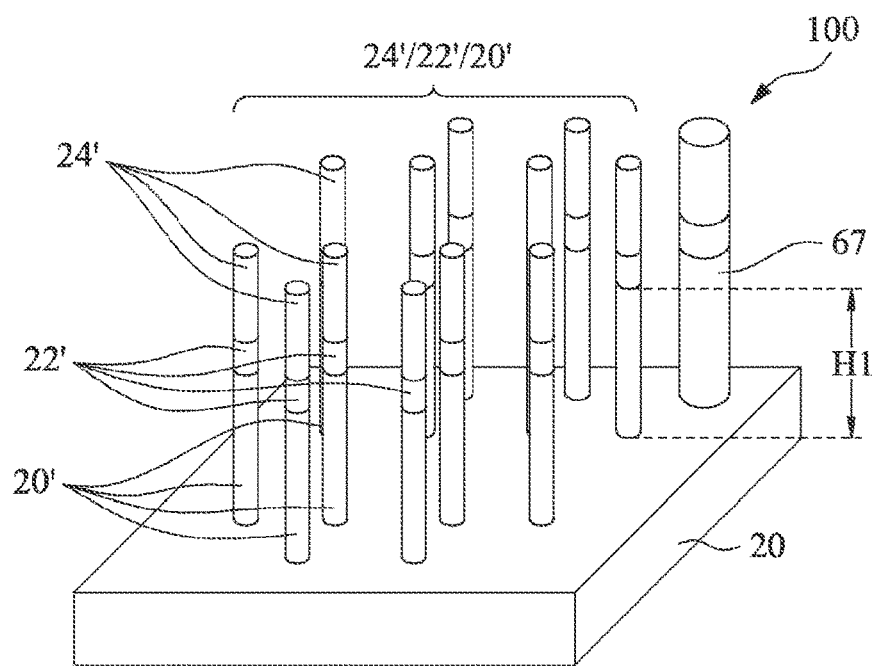

Next, as shown in FIGS. 22A and 22B, which illustrate a perspective view and a top view, respectively, pad dielectric layer 22 and substrate 20 are etched using the overlying patterned features such as nanowires 24', 26', and 28'' as in FIGS. 21A and 21B. As a result, nano patterns 22' are formed. Furthermore, portions of substrate 20 that are protected by nanowires 24' and nanowires 26' form semiconductor nanowires 20'. Semiconductor nanowires 20' form vertical nanowires with lengthwise directions perpendicular to the major top surface and bottom surface of substrate 20. The height H1 of semiconductor nanowires 20' is determined by the intended usage of semiconductor nanowires 20'. At the time semiconductor nanowires 20' are formed, semiconductor post 67, which is a portion of the etched semiconductor substrate 20, is also formed due to the formation of large photo resist pattern 64.

Figure 23:
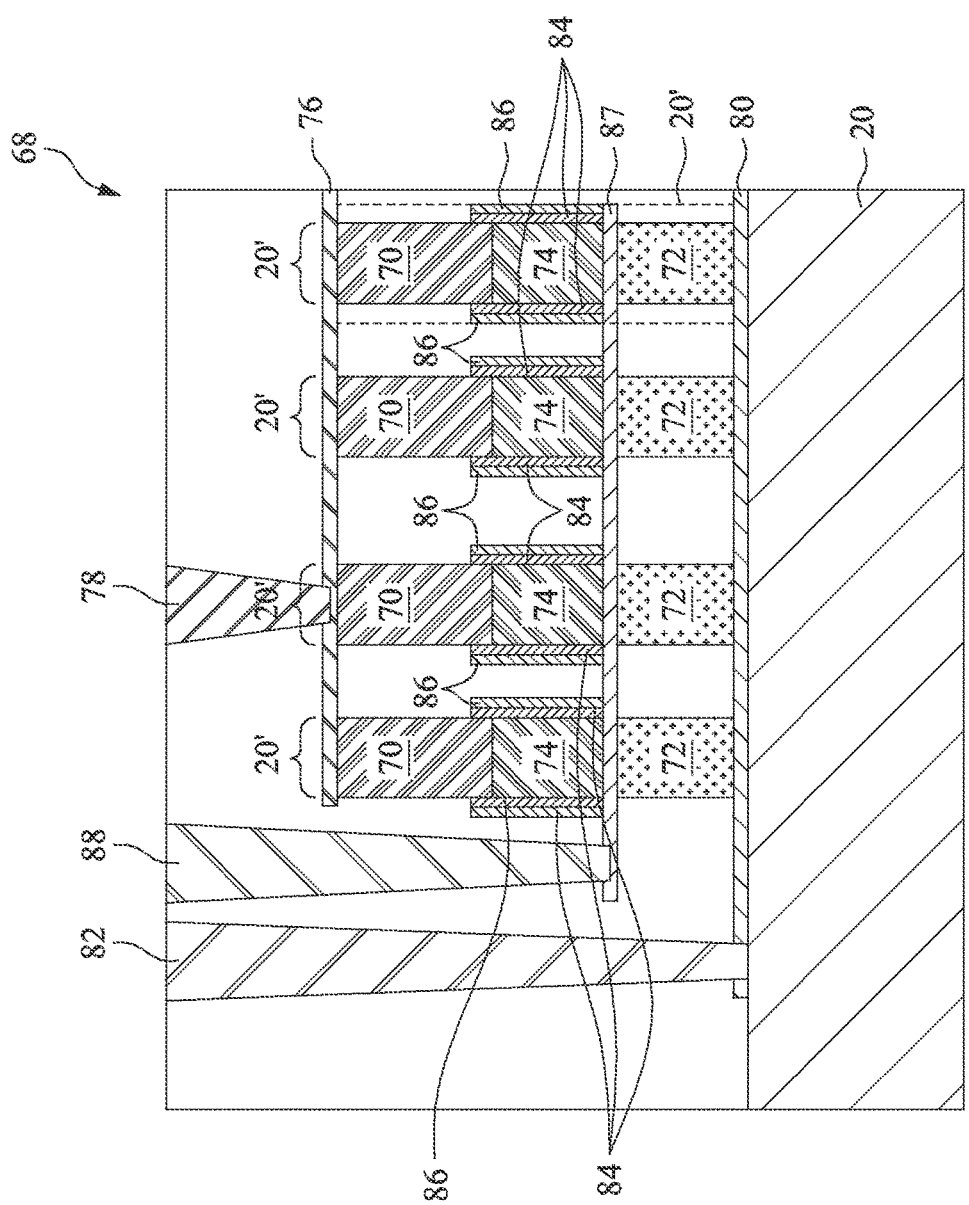
FIG. 23 illustrates the cross-sectional view of a transistor in accordance with some embodiments, wherein the transistor includes semiconductor nanowires.

In subsequent steps, the remaining portions of nanowires 24' and nanowires 26' are removed in etching steps. Semiconductor nanowires 20' may then be used to form integrated circuit devices such as transistors. For example, FIG. 23 illustrates a cross-sectional view of transistor 68 formed based on nanowires 20'. In accordance with some exemplary embodiments, transistor 68 includes a plurality of nanowires 20', each including source/drain regions 70 and 72, and channel region 74 between source/drain regions 70 and 72. The plurality of source/drain regions 70 includes the top portions of nanowires 20', and is electrically interconnected through conductive layer 76, which is further connected to source/drain contact plug 78. The plurality of source/drain regions 72, which includes the bottom portions of nanowires 20', is interconnected through conductive layer 80, which is further connected to source/drain contact plug 82. A plurality of gate dielectrics 84 is formed to surround channel regions 74, which are the middle portions of nanowires 20'. Conductive layers 86 are formed to surround the plurality of gate dielectrics 84. Conductive layers 86 act as the gate electrodes of transistor 68. Conductive layers 86 are connected to conductive layer 87, which is further connected to gate contact plug 88. Accordingly, transistor 68 includes a plurality of sub-transistors, each formed based on one of nanowires 20', with the plurality of sub-transistors connected in parallel.

Figure 24:
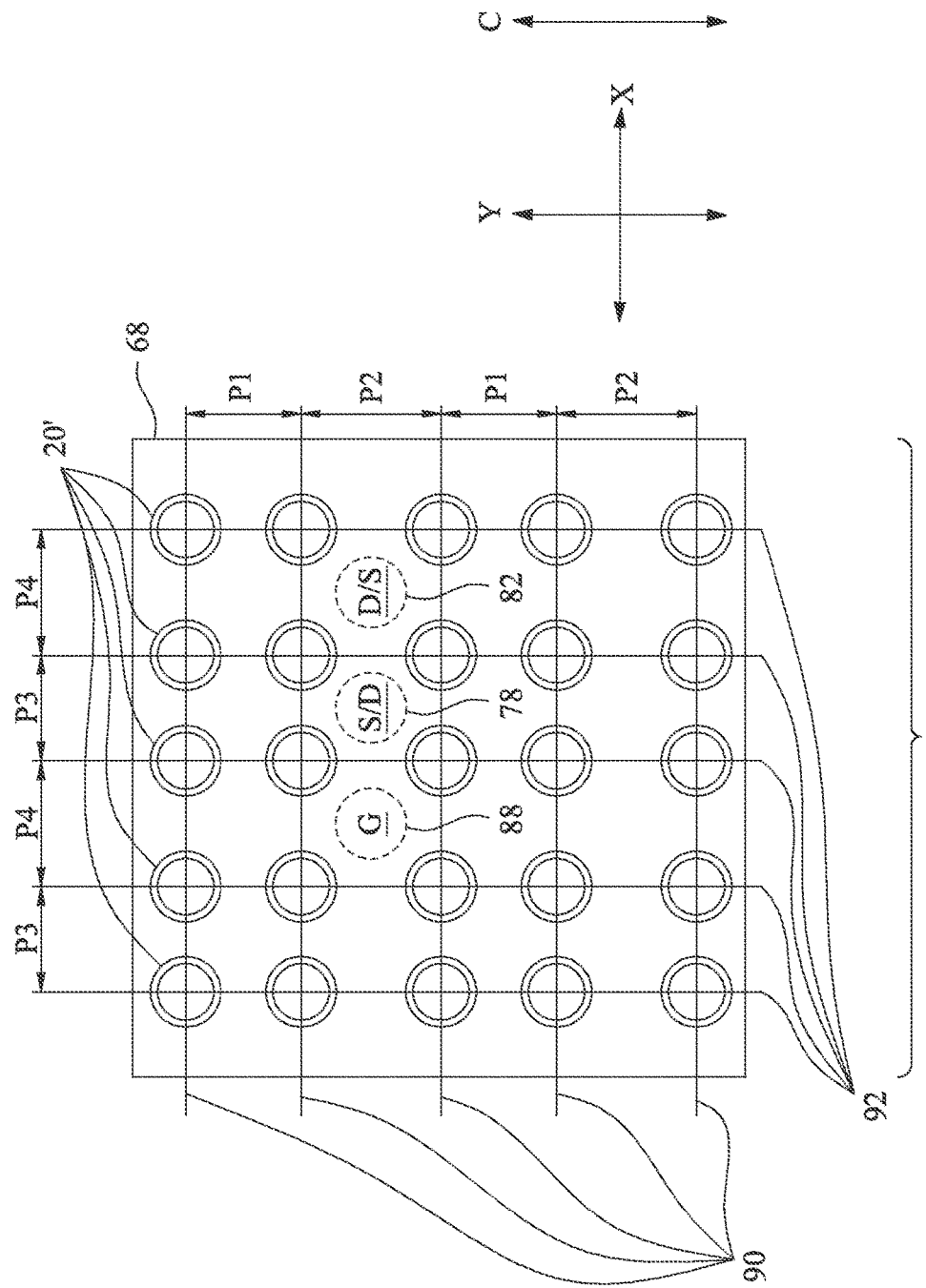
FIG. 24 illustrates nanowires arranged as a plurality of rows and columns in accordance with some embodiments, with the rows perpendicular to the columns.

FIG. 24 illustrates a top view of transistor 68 in accordance with some embodiments. Transistor 68 includes a plurality of semiconductor nanowires 20' forming the sub-transistors of transistor 68. Contact plugs 78, 82, and 88 are also illustrated as an example, and are connected to source or drain regions (denoted as S/D and D/S regions). In FIG. 24, the C direction (also refer to FIG. 9) is parallel to the Y direction. Semiconductor nanowires 20' are aligned to lines 90 and 92, wherein lines 90 are perpendicular to lines 92. Due to the self-aligned multi-patterning process for forming semiconductor wires, semiconductor nanowires 20' are aligned to a plurality of rows 90 and columns 92. The pitches of the rows are illustrated as pitches P1 and P2. One of the pitches P1 and P2 is determined by one of the width W1 and distance D1 (FIG. 1), and the other one of the pitches P1 and P2 is determined by the other one of the width W1 and distance D1. Accordingly, as shown in FIG. 24, pitches P1 and P2 are arranged in an alternating layout.

Similarly, the pitches of the columns of semiconductor nanowires 20' are illustrated as pitches P3 and P4. One of the pitches P3 and P4 is determined by one of the width W2 and distance D2 (FIG. 8), and the other one of the pitches P3 and P4 is determined by the other one of the width W2 and distance D2. Accordingly, pitches P3 and P4 are arranged in an alternating layout.

Figure 25:
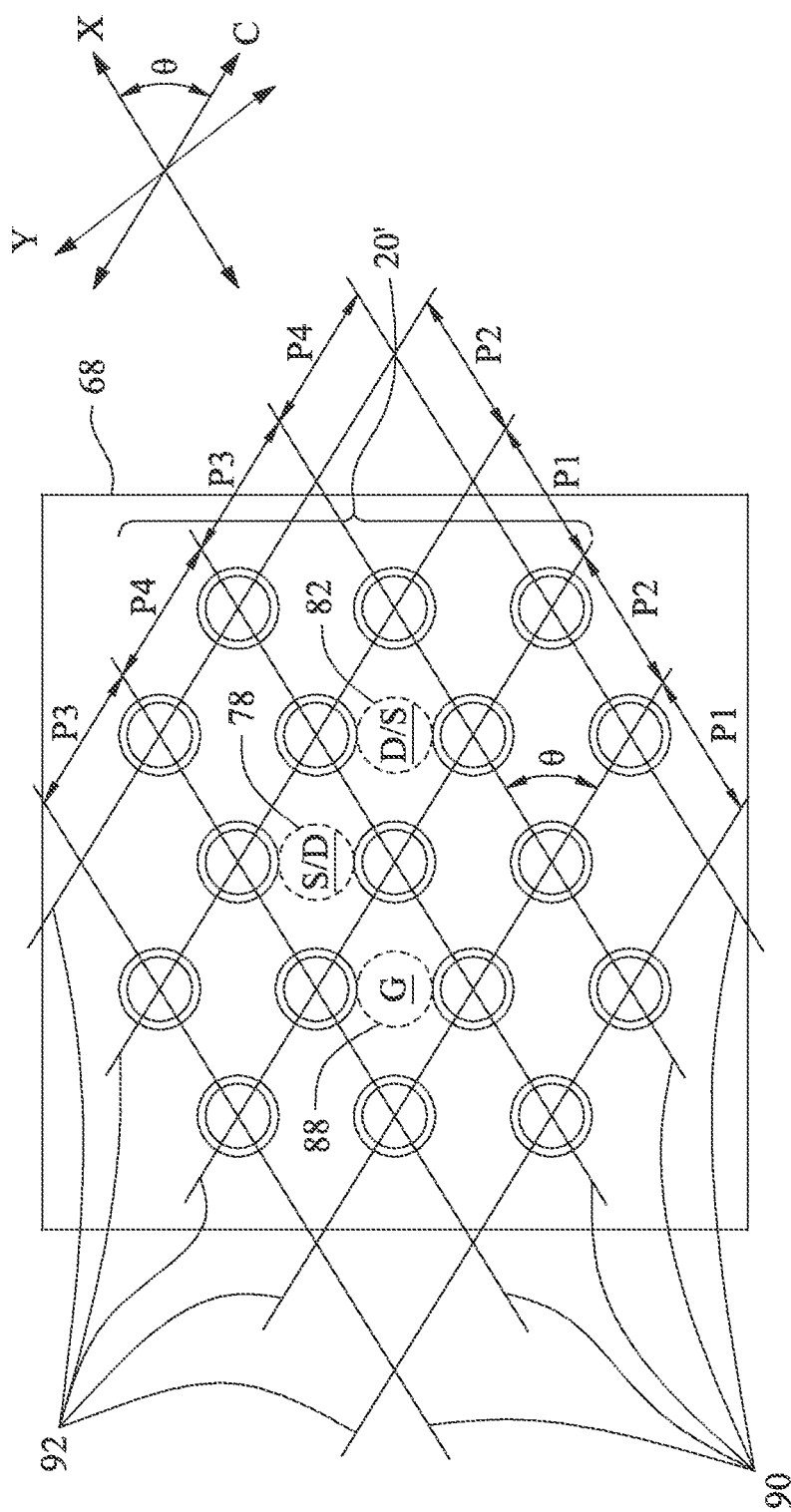
FIG. 25 illustrates nanowires arranged as a plurality of rows and columns in accordance with some embodiments, with the rows neither perpendicular to nor parallel to the columns.

FIG. 25 illustrates a top view of transistor 68 in accordance with alternative embodiments. These embodiments are similar to the embodiments in FIG. 24, wherein semiconductor nanowires 20' are aligned to lines 90 and 92. The semiconductor nanowires 20' aligned to lines 90 form rows, and the semiconductor nanowires 20' aligned to lines 92 form columns. Lines (rows) 90 and (column) 92, however, are neither perpendicular to each other nor parallel to each other. Lines 90 are in the X direction, and lines 92 are in the C direction. The X direction and the C direction form angle θ, which is between, and not including, zero degree and 90 degrees. Again, pitches P1 and P2 are allocated alternatingly, and pitches P3 and P4 are allocated alternatingly.

The embodiments of the present disclosure have some advantageous features. By using self-aligned multi-patterning process in two directions to form the patterns of nanowires, the sizes of the semiconductor nanowires may be reduced to smaller than the limit of the lithography process. The risk of overlay misalignment between patterns is low.

In accordance with some embodiments of the present disclosure, a method includes forming a pattern-reservation layer over a semiconductor substrate. The semiconductor substrate has a major surface. A first self-aligned multi-patterning process is performed to pattern a pattern-reservation layer. The remaining portions of the pattern-reservation layer include pattern-reservation strips extending in a first direction that is parallel to the major surface of the semiconductor substrate. A second self-aligned multi-patterning process is performed to pattern the pattern-reservation layer in a second direction parallel to the major surface of the semiconductor substrate. The remaining portions of the pattern-reservation layer include patterned features. The patterned features are used as an etching mask to form semiconductor nanowires by etching the semiconductor substrate.

In accordance with alternative embodiments of the present disclosure, a method includes forming a pattern-reservation layer over a semiconductor substrate, etching the pattern-reservation layer using a first self-aligned multi-patterning process to form pattern-reservation strips, forming a filling material to fill spacers between the pattern-reservation strips, and etching the pattern-reservation strips using a second self-aligned multi-patterning process. The remaining portions of the pattern-reservation strips form patterned features. Each of the first self-aligned multi-patterning process and the second self-aligned multi-patterning process includes forming mandrel strips, wherein the mandrel strips of the first self-aligned multi-patterning process have a first lengthwise direction different from a second lengthwise direction of the mandrel strips of the second self-aligned multi-patterning process. Each of the first self-aligned multi-patterning process and the second self-aligned multi-patterning process further includes forming spacers on sidewalls of the mandrel strips, and removing the mandrel strips. The mandrel strips are used as an etching mask to etch the pattern-reservation layer in the first self-aligned multi-patterning process and the second self-aligned multi-patterning process. The patterned features are used as an etching mask to form semiconductor nanowires by etching the semiconductor substrate.

In accordance with yet alternative embodiments of the present disclosure, an integrated circuit structure includes a semiconductor substrate, and a plurality of semiconductor nanowires over the semiconductor substrate. The plurality of semiconductor nanowires is disposed as a plurality of rows and a plurality of columns. The plurality of rows has a first pitch and a second pitch different from the first pitch, wherein the first pitch and the second pitch are allocated in an alternating pattern. The plurality of columns has a third pitch and a fourth pitch different from the third pitch, wherein the third pitch and the fourth pitch are allocated in an alternating pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   performing a first etching process to etch a pattern-reservation layer, with remaining portions of the pattern-reservation layer forming pattern-reservation strips;
   filling a filling material into spaces left by etched portions of the pattern-reservation layer;
   performing a second etching process to etch the pattern-reservation strips and the filling material, wherein remaining portions of the pattern-reservation strips form pattern-reservation nanowires; and
   etching a semiconductor substrate underlying the pattern-reservation nanowires, with the pattern-reservation nanowires being used as an etching mask.

2. The method of claim 1, wherein the second etching process comprises:
   etching the filling material; and
   etching the pattern-reservation strips, wherein the etching the filling material and the etching the pattern-reservation strips are separate etching processes.

3. The method of claim 1, wherein the pattern-reservation strips have first lengthwise directions parallel to a first direction, and the second etching process is performed using elongated strips as an etching mask, and the elongated strips extend in a second direction non-parallel to the first direction, and the first direction and the second direction are parallel to a major surface of the semiconductor substrate.

4. The method of claim 3, wherein the first direction is perpendicular to the second direction.

5. The method of claim 1, wherein in the first etching process, an oxide layer over the pattern-reservation layer is also etched to form oxide strips, and in the second etching process, the oxide strips are etched to form oxide nanowires.

6. The method of claim 5, wherein the filling material is further filled into additional spaces left by etched portions of the oxide layer.

7. The method of claim 6 further comprising, after the filling material is applied, performing a planarization process to level a top surface of the filling material with top surfaces of the oxide strips.

8. The method of claim 1, wherein each of the first etching process and the second etching process comprises:
   forming a mandrel layer;
   etching the mandrel layer to form mandrel strips;
   forming a spacer layer on the mandrel layer;
   removing horizontal portions of the spacer layer and leaving vertical portions of the mandrel layer as spacers; and
   removing the mandrel strips, wherein the spacers are used as an etching mask in respective ones of the first etching process and the second etching process.

9. The method of claim 8, wherein longitudinal direction of the mandrel strips used in the first etching process is neither perpendicular to nor parallel to longitudinal direction of the mandrel strips used in the second etching process.

10. The method of claim 1 further comprising rounding the pattern-reservation nanowires before the pattern-reservation nanowires are used to etch the semiconductor substrate.

11. The method of claim 1 further comprising, after the first etching process and the second etching process, forming a photo resist over the semiconductor substrate, wherein in the etching the semiconductor substrate, a pattern of the photo resist and patterns of the pattern-reservation nanowires are transferred simultaneously into the semiconductor substrate.

12. A method comprising:
   forming a first amorphous silicon layer over a semiconductor substrate;
   forming a patterned second amorphous silicon layer over the first amorphous silicon layer;
   forming first spacers based on the patterned second amorphous silicon layer;
   removing the patterned second amorphous silicon layer;
   etching the first amorphous silicon layer using the first spacers as a first etching mask;
   forming a patterned third amorphous silicon layer over the first amorphous silicon layer;
   forming second spacers based on the patterned third amorphous silicon layer;
   removing the patterned third amorphous silicon layer;
   etching the first amorphous silicon layer using the second spacers as a second etching mask to form amorphous silicon nanowires; and
   transferring patterns of the amorphous silicon nanowires into the semiconductor substrate to form semiconductor nanowires.

13. The method of claim 12 further comprising:
   before the transferring the patterns, oxidizing outer portions of the amorphous silicon nanowires to form oxide rings encircling inner portions of the amorphous silicon nanowires; and
   removing the oxide rings.

14. The method of claim 12 further comprising:
   after the etching using the first etching mask, filling a filling material to embed remaining portions of the first amorphous silicon layer.

15. The method of claim 14, wherein in the etching using the second etching mask, the filling material is also etched.

16. The method of claim 12 further comprising forming vertical transistors based on the semiconductor nanowires.

17. A method comprising:
   forming amorphous silicon nanowires;
   rounding the amorphous silicon nanowires;
   transferring patterns of the rounded amorphous silicon nanowires into a semiconductor substrate underlying the rounded amorphous silicon nanowires to form semiconductor nanowires; and
   forming vertical transistors based on the semiconductor nanowires, with portions of the semiconductor nanowires acting as channel regions of the vertical transistors.

18. The method of claim 17, wherein the forming the amorphous silicon nanowires comprises:
   depositing an amorphous silicon layer; and
   performing a first etching process and a second etching process to etch the amorphous silicon layer and to form the amorphous silicon nanowires.

19. The method of claim 18, wherein in each of the first etching process and the second etching process, some portions of the amorphous silicon layer are removed.

20. The method of claim 18, wherein the first etching process is performed using first strips as a first etching mask, and the second etching process is performed using second strips as a first etching mask, and the first strips and the second strips have longitudinal directions perpendicular to each other.

* * * * *